(12) United States Patent
Pham-Van-Diep et al.

(10) Patent No.: US 6,224,180 B1
(45) Date of Patent: *May 1, 2001

(54) HIGH SPEED JET SOLDERING SYSTEM

(76) Inventors: Gerald Pham-Van-Diep, 1500 Priscilla La., Newport Beach, CA (US) 92660; E. Philip Muntz, 1560 E. California Blvd., Pasadena, CA (US) 91106; Hal Watts, 44 Nola Dr., Holden, MA (US) 01520; William Johnson, 49 Crescent St., Franklin, MA (US) 02038; Melvin Main, 16 Vegas Dr., Hanover, PA (US) 17331; Robert F. Smith, 337 E. 18th St., Costa Mesa, CA (US) 92627; Melissa E. Ormé-Marmarelis, 26 Whistler Ct., Irvine, CA (US) 92612

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/803,758

(22) Filed: Feb. 21, 1997

(51) Int. Cl.⁷ ........................................ B41J 3/00

(52) U.S. Cl. ................... 347/2; 347/75; 347/78; 347/81

(58) Field of Search ............................. 347/1, 3, 88, 99, 347/102, 73, 75, 76, 77, 19, 37, 87, 25, 84, 78, 81

(56) References Cited

U.S. PATENT DOCUMENTS

| | | | |
|---|---|---|---|
| 4,044,970 | 8/1977 | Maudal | 244/3.22 |
| 4,048,639 | * 9/1977 | Walsh et al. | 347/78 |
| 4,060,813 | * 11/1977 | Yamada et al. | 347/80 |
| 4,138,687 | * 2/1979 | Cha et al. | 347/75 |

(List continued on next page.)

FOREIGN PATENT DOCUMENTS

| | | |
|---|---|---|
| 0598182 | 5/1994 | (EP) . |
| 0752294 A2 | 1/1997 | (EP) . |
| 63-004657 | 1/1988 | (JP) . |
| WO 96/09121 | 3/1996 | (WO) . |
| WO 97/25175 | 7/1997 | (WO) . |

OTHER PUBLICATIONS

Orme, "Precision Droplet Streamline Manufacturing", Proceedings of the International Conference On Advanced Synthesis of Engineered Structural Materials, Aug. 31–Sep. 2, 1992, San Francisco, CA pp. 237–244.

Orme, "Rapid Solidification Materials Synthesis With Nano–Liter Droplets", SAE Technical Paper Series, Aerotech '93, Costa Mesa, CA, Sep. 27–30, 1993, pp. 113–118.

Orme, "A Novel Technique of Rapid Solidification Net–Form Materials Synthesis", Journal of Materials Engineering and . Performance, vol. 2, No. 3, Jun. 1993, pp. 399–405.

(List continued on next page.)

*Primary Examiner*—John Barlow
*Assistant Examiner*—Craig A. Hallacher
(74) *Attorney, Agent, or Firm*—Mintz, Levin, Cohn, Ferris, Glovsky and Popeo, P.C.

(57) ABSTRACT

Continuous jetting of liquid metal droplets for deposit on a substrate includes an ejector, a deflection device, a print chute, and a collection reservoir. Liquid metal from a cartridge in the ejector provides a continuous molten material stream through an orifice-defining structure while a vibration device creates a standing wave in the stream to break the molten material stream into individual droplets which receive charge from a charging device. The deflection device enables the positioning of the charged droplets to be controlled for placement on a substrate. Control systems assist in the calibration and control of the continuous stream to ensure that selected droplets are placed at desired locations on the substrate.

21 Claims, 17 Drawing Sheets

U.S. PATENT DOCUMENTS

| | | | | |
|---|---|---|---|---|
| 4,361,845 | * | 11/1982 | Smith | 347/90 |
| 4,551,731 | * | 11/1985 | Lewis et al. | 347/78 |
| 4,612,553 | * | 9/1986 | Kohler | 347/6 |
| 4,800,398 | * | 1/1989 | Naruse et al. | 347/49 |
| 4,809,015 | * | 2/1989 | Bowling et al. | 347/74 |
| 4,847,631 | * | 7/1989 | Naruse et al. | 347/49 |
| 5,193,738 | * | 3/1993 | Hayes | 347/1 |
| 5,229,016 | * | 7/1993 | Hayes et al. | 222/590 |
| 5,377,902 | * | 1/1995 | Smith et al. | 222/237 |
| 5,377,961 | * | 1/1995 | Smith et al. | 266/237 |
| 5,415,679 | * | 5/1995 | Wallace | 75/331 |
| 5,560,543 | * | 10/1996 | Smith et al. | 239/102.2 |
| 5,643,353 | * | 7/1997 | Smith et al. | 347/1 |

OTHER PUBLICATIONS

Wallase, "Automated Electronic Circuit Manufactuirng Using Ink–Jet Technology", Transactions of the ASME, vol. 111, pp. 108–111, Jun., 1989.

Hayes et al., "Application of Ink Jet Technology to Microelectronic Packaging", ISHM '89 Proceedings Proceedings, Maryland, pp. 627–634.

Priest et al., Liquid Metal_Jetting Technology: Application Issues For Hybrid Technology, The International Journal of Microcircuits and Electornic Packaging, vol. 17, No. 3, Third Quarter 1994, pp. 219–227.

Priest et al., "Liquid Metal–Jetting: Its Application To SMT", Journal of SMT, Oct. 1993, pp. 4–10.

* cited by examiner

HIGH SPEED JET SOLDERING SYSTEM

This application incorporates by reference U.S. patent application Ser. Nos. 08/533,648; 8/533,515; 08/533,508; 08/533,511; 08/533,509; 08/533,510; 08/583,641; 08/718,605; 8/718,607; 08/719,117; 08/724,034.

BACKGROUND OF THE INVENTION

This invention relates generally to a method and apparatus for jetting liquid metal, and ore specifically to a continuous mode solder jetting system and method.

Various soldering schemes have been developed for electrically bonding semiconductor integrated circuit (IC) chips to a substrate (e.g., a printed circuit board). In some schemes, a semiconductor IC chip is bonded to a substrate by applying a small solder bump to the bottom surface of the chip, aligning the solder bump with a bond pad on the surface of the substrate, and heating the solder bump until it reflows. In some other schemes, solder bumps are applied to bonding pads on a substrate; afterwards, electronic components are bonded to the substrate by positioning the components over the solder bumps and by heating and reflowing the solder bumps. In some schemes IC chips are bonded to a patterned layer of solder created by applying a thin layer of solder paste to a substrate through holes in a stencil, leaving a selected solder pattern on the substrate. Recently, solder jet systems have been proposed for depositing molten solder droplets onto a substrate in a selected pattern. Such systems include a solder droplet ejector, which may eject solder droplets on-demand or continuously.

SUMMARY OF THE INVENTION

Embodiments of the present invention are directed to an apparatus for providing continuous jetting of liquid metal droplets. In one embodiment, a jetting apparatus includes a liquid metal ejector for providing a continuous stream of charged droplets, a deflection device, a print chute and a collection reservoir. During operation of the jetting apparatus, the droplets are either deflected by the deflection device to cause the droplets to pass through the print chute and be deposited on a substrate, or the droplets are deposited into the collection reservoir. In embodiments of the invention, the jetting system includes control systems for calibrating and controlling the continuous stream of droplets to ensure that the selected droplets are placed at desired locations on a substrate.

In one embodiment, the ejector of the liquid metal dispensing system has a replaceable cartridge with an orifice-defining structure, a vibration device, and a charging device. As the liquid metal leaves the ejector, a standing wave is produced in the stream by the vibration device to break the stream into individual droplets. These droplets are surrounded by an inert gas from a gas delivery system to prevent oxidation of the droplets. As the droplets separate from the stream, an electric charge is selectively applied by the charging device on a droplet-by-droplet basis. This charge enables the deflection device to adjust the position of the droplets.

DETAILED DESCRIPTION

For purposes of illustration only, and not to limit generality, the present invention will now be explained with reference to a continuous liquid metal jetting system used to dispense solder onto a top surface of a substrate such as printed circuit boards, integrated circuits, or packages. One skilled in the art will appreciate, however, that embodiments of the present invention are not limited to solder jetting systems, and are not limited to jetting systems for printed circuit boards, but rather, the apparatus and methods in accordance with embodiments of the present invention may be used in other applications requiring precision deposition of conductive liquids, such as liquid metals. For convenience purposes only, and not to limit generally, reference will be made to the conductive liquid throughout as a liquid metal or solder.

Figure 1:
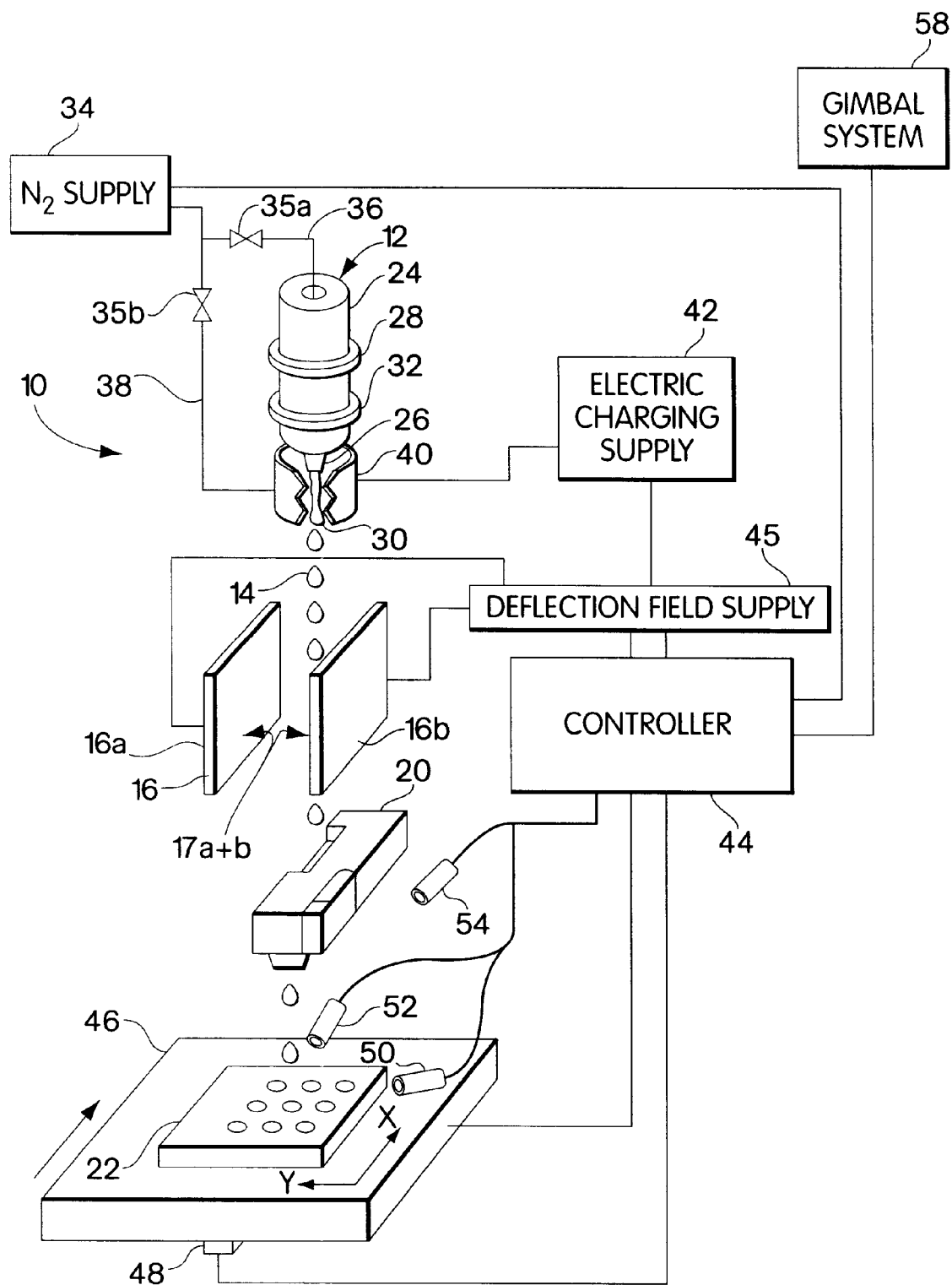
FIG. 1 is a diagrammatic perspective view of a jet soldering system for depositing solder droplets onto a substrate.

The major components and general operation of a jet soldering system 10 in accordance with one embodiment of the present invention will be described with reference to FIG. 1. The jet soldering system 10 includes a solder ejector 12 for providing a continuous stream of charged droplets 14 and a pair of deflection plates 16 for passing the droplets 14 through to a collection reservoir 20, or for deflecting the droplets 14 toward a substrate 22. The substrate 22 may be a printed circuit board or other substrate on which one or more items, such as semiconductor IC chips, are to be mounted. The jet soldering system includes a controller 44 that controls the operation of the system.

The solder ejector 12 includes a replaceable cartridge 24 having an orifice defining structure 26 at its bottom and a vibration device 28, which produces a standing wave in the stream of solder 30 as the stream leaves the ejector 12. The standing wave controls formation of the droplets 14. The ejector 12 includes a heater 32 which melts solder contained within the cartridge 24.

A gas delivery system 34 supplies nitrogen or another inert gas, such as argon, along a gas line 36 in order to pressurize the cartridge 24 and control the formation of solder droplets 14 as they leave the ejector 12. The inert gas is also supplied via line 38 to a laminar flow producing structure 40 to provide a laminar flow of inert gas around droplets 14. Preferably, the inert gas is high purity gas such as research grade or better. Regulators 35a and 35b are connected respectively in gas lines 36 and 38. The controller 44 controls the flow of the inert gas using the regulators 35a and 35b.

A droplet charging supply 42 is electrically connected to a charging device 60 (shown in FIG. 5) positioned around the stream 30 at the location of droplet formation. The droplet charging supply applies electric pulses to the charging device to selectively charge the droplets 14 on a droplet-by-droplet basis as the droplets 14 separate from the stream 30.

The deflection device is implemented using a pair of conductive plates 16a and 16b having respective parallel charge faces 17a and 17b for developing an electric field therebetween. A deflection field power supply 45 is used to apply a bias voltage to the deflection device 16. The bias voltage provided by the deflection field power supply 45 is monitored and controlled by the controller 44. Electromagnetic deflection devices are also possible for use with the present invention.

The jet soldering system 10 includes a linear x-y translation table 46, on which the substrate 22 is mounted. The position of the x-y translation table is controllable by the controller 44. The x-y translation table includes a position indicator 48 that provides signals to the controller 44 to enable the controller to precisely monitor the position of the translation table 46.

The jet soldering system further includes a viewing system and a gimbal control system. These systems are used to calibrate and control the jetting of the droplets onto the substrate 22. The viewing system includes cameras 50, 52 and 54, shown in FIG. 1.

The gimbal system provides vertical alignment of the ejector 12 with the substrate 22 and also provides rotation of the deflection plates 16 to provide an offset angle between the deflection plates and the Y axis of the substrate. The viewing system and the gimbal system are described in greater detail hereinafter.

Once a substrate has been properly loaded into the jetting system, the jetting of solder droplets is initiated by increasing the pressure of the nitrogen in the cartridge 24 to increase the pressure of the solder at the orifice. The velocity of the stream ejected from the ejector is directly proportional to the square root of the pressure difference above and below the orifice. Preferably, the pressure difference is maintained at about 0.01%. A periodic electric waveform having a magnitude of about 50–300 volts and a fundamental frequency (F) of preferably about 12,000 Hz is then applied to the vibration device 28. The frequency F of the waveform to the vibration device is determined using the equation below:

$$F=(k \times V)/2\Pi r_0$$

Where: k is a constant that varies between 0.4 and 0.8,
V is droplet velocity, and
$r_0$ is the orifice radius.

For example, for a 100 micron diameter orifice, and a velocity of 5 meters/second, the frequency is set to approximately 12,000 Hz. This is by no means limiting, as other frequencies can be used. Further, the frequency may be slightly varied about the frequency calculated using the equation above, causing the point at which droplets are formed in the stream to vary accordingly.

During operation, table 46 is moved along the X axis, and the charge applied to each droplet 14 controls whether the droplet 14 is passed undeflected to the collection device 20 or is deflected toward substrate 22 along a "fan" axis parallel to the Y axis and transverse to the X axis. The fan axis is perpendicular to the charge faces 17 of the deflection plates 16. The magnitude of the charge on droplet 14 determines the extent of deflection along the fan axis. Through the movement of the substrate 22 and the deflection of the droplets along the fan axis, the droplets 14 can be directed in two axes to any desired location on the substrate surface. For substrates having a width which is greater than the deflection range along the fan axis, multiple scans along the X axis, with the table 46 being translated to a different position along the Y axis for each scan, may be performed to achieve droplet deposition across the entire top surface of the substrate.

To permit printing of a substrate in a minimum time, it is desirable to continuously move the table and the substrate on it, in the scan direction, ie., along the X axis. This, however, prevents the deposition of droplets at a plurality of locations that have the same X axis coordinate but different fan axis coordinates. For example, if the fan axis were perpendicular to the X axis, ie., the Y axis, and the pattern of solder locations included a row having the same X axis coordinate but different Y axis coordinates, only one droplet 14 could be deposited because table 46 and substrate 22 move in the time between droplets, namely 1/(12,000 Hz) or 0.000083 second, assuming a frequency of 12,000 Hz.

Figure 2:
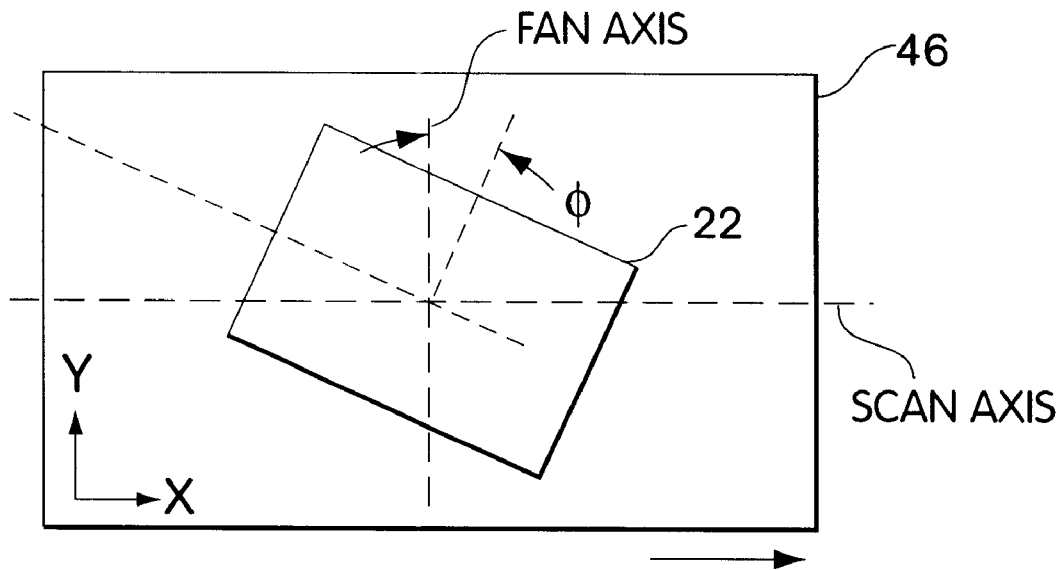
FIG. 2 is a diagrammatic plan view of a substrate oriented at an offset angle relative to the motion of a substrate translation table.
Figure 3:
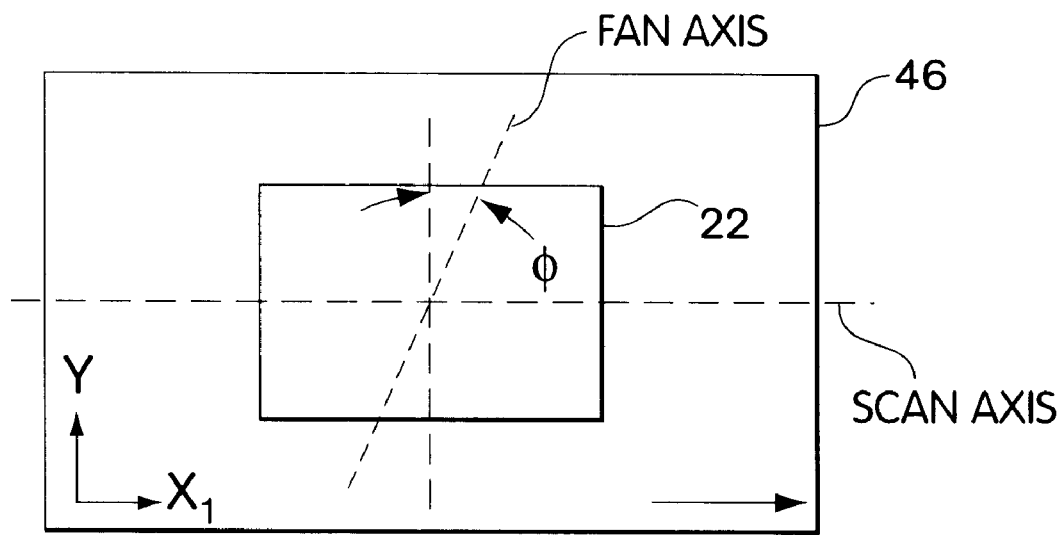
FIG. 3 is a diagrammatic view showing a fan axis for deflecting solder droplets in the FIG. 1 system oriented at an offset angle relative to the motion of the translation table.

To deposit droplets 14 on substrate 22 at locations along such axes, the relative orientation of substrate 22 and the droplet fan axis is adjusted. FIG. 2 illustrates the rotation of the substrate 22 by an off-set angle (ø) relative to the direction of table translation along the scan axis, ie., the X axis, to adjust the orientation of the system relative to the fan axis. FIG. 3 illustrates the rotation of the deflection device 16 by an offset angle (ø) away from the Y axis (90° relative to the direction of table motion) to adjust the orientation of the substrate relative to the fan axis. The offset angle ø can typically be adjusted with an accuracy of ±0.01°. It is in general preferable to rotate the deflection device 16 using the gimbal system rather than the substrate, so that the direction of traverse (along the scan axis) can be selected independent of the traverse speed.

The offset angle ø is selected for a given pattern of solder pads on a substrate 22 so that, at any given position of table 46 in its travel along the X axis, there is only one solder droplet 14 that needs to be deposited along the transverse fan axis. In addition, the angle ø is selected so that the distance that table 46 moves in the time between any two droplets being deposited on substrate 22 is maximized, thereby permitting table 22 to be moved at the highest possible speed while still depositing all droplets 14 that need to be deposited. Soldering system 10 is capable of depositing solder droplets at a higher accuracy than generally required by user manufacturing specifications, and the excess allowable error in solder droplet location is used to slightly redefine the user-specified locations for droplets 14, in order to adjust the positions of droplets 14 so as to space them along the X axis and thereby permit increased table velocity.

Figure 4:
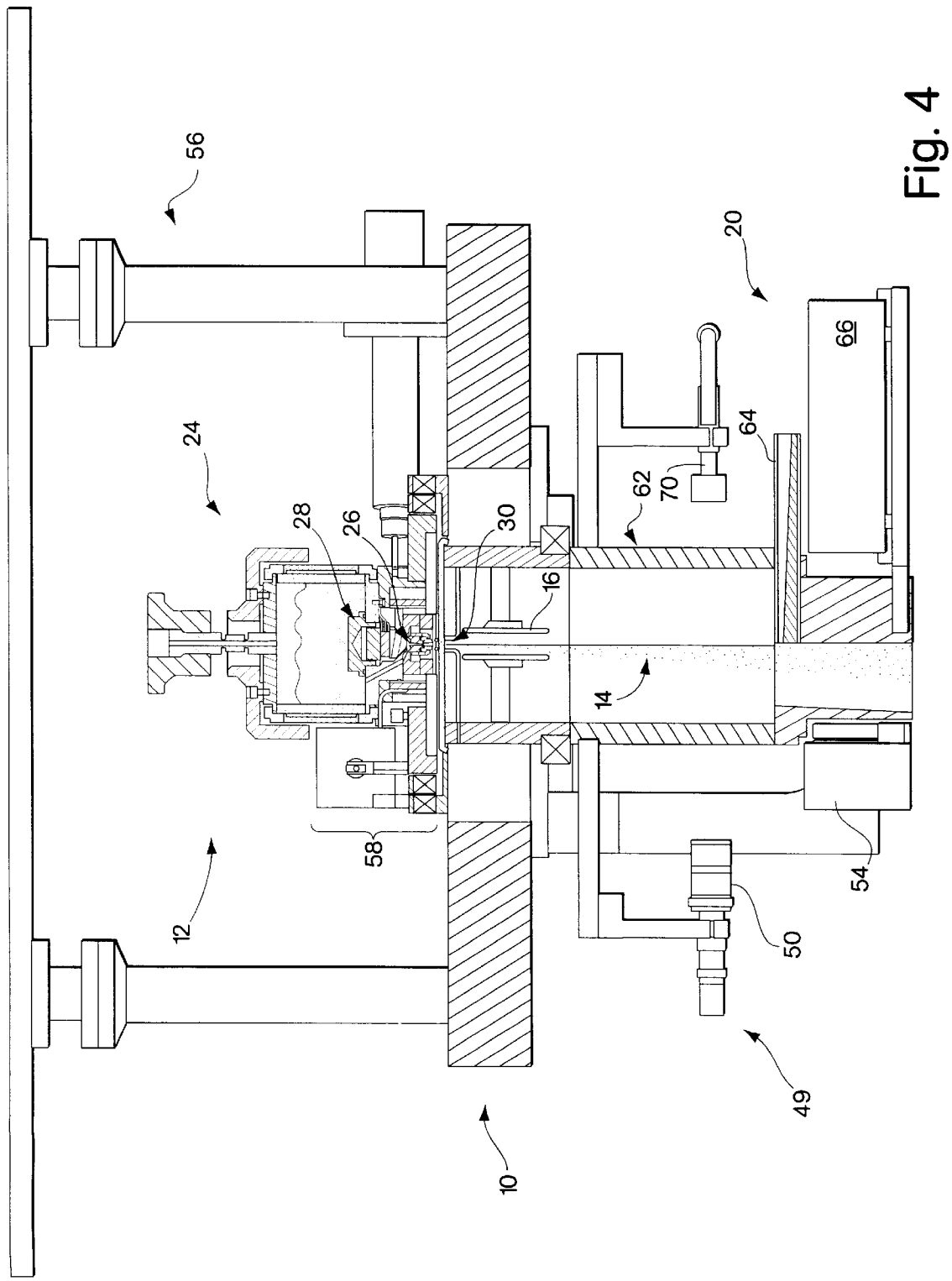
FIG. 4 is a schematic illustration of a high speed jet soldering system in accordance with one embodiment of the present invention.

Referring to FIG. 4, the jet soldering system 10 is shown in greater detail and mounted on a framework 56. The jet soldering system includes the ejector 12, an environmental chamber 62 and a vision alignment system 49. The ejector 12 is positioned relative to the substrate 22 and includes a replaceable cartridge 24 which has a cavity 106 filled with solder material 108. The solder 108 is ejected from the ejector through an orifice defining structure 26. The solder ejector device 12 is shown releasing a stream of solder 30 which is broken into solder droplets 14 and passes through deflection device 16 contained within the environmental chamber 62. From the environmental chamber 62, the droplets 14 are selectively deflected through print slot 68 and onto a substrate 22 or alternatively are deflected to the collection device 20 which includes a catch chute 64 and reservoir 66. An inert gas atmosphere protects the solder from oxygen within the environmental chamber 62 and collection device 20. Solder which accumulates in reservoir 66 can be recycled back to the jet soldering system 10.

All of the system components which generate the charged liquid droplets (ie., the cartridge 24, the vibrator device 28, and the orifice defining structure 26) are, in one embodiment of the present invention, incorporated into a removable cartridge device 24. Once filled with the desired material for jetting, a cartridge 24 can be installed into the jetting system 10 for operation.

The solder material 108 used for the present invention is, in one embodiment, a purified solder material. Purification of the solder may be accomplished by standard heating and filtering methods known in the art, and under a controlled environment. By use of a purified solder, control over the solder stream 30 is increased. This is because impurities in the solder 108 create flow disturbances in the stream 30 which causes the stream 30 to move or "walk" from its desired position. Additionally, a solder which has been purified decreases the amount of oxides in the solder, as is known in the art. The presence of oxides in the solder material causes rapid stream degradation, which may cause the stream to the stream 30 to "jump" from its desired position. By removing the oxides, improved control of the solder stream position is made.

Figure 5:
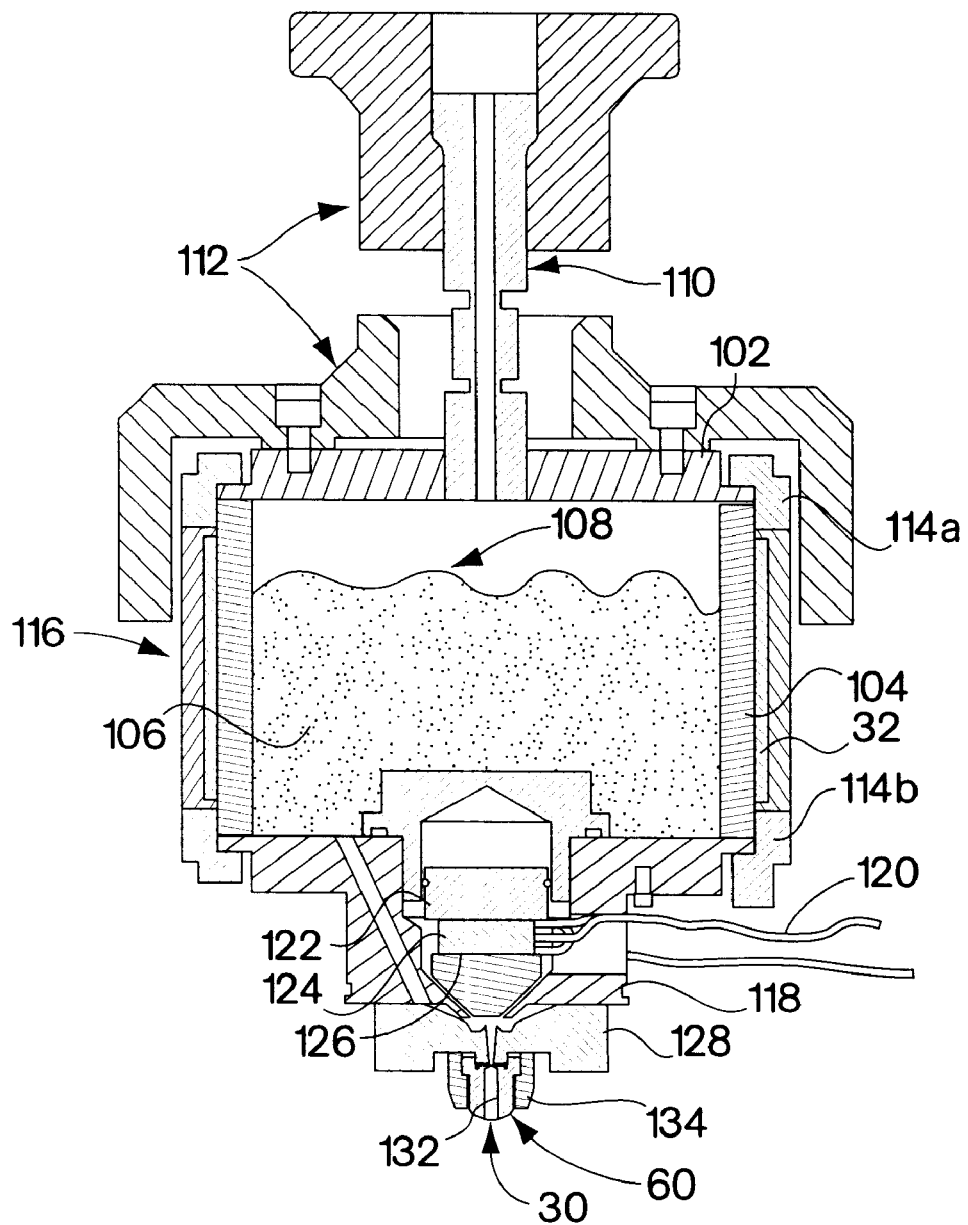
FIG. 5 is a sectional view of a cartridge device of the embodiment shown in FIG. 4.

Referring to FIG. 5, the cartridge 24, including the vibration device 28 and the orifice defining structure 26 can be seen in greater detail. The cartridge 24 includes a cartridge top 102 and a cartridge body 104 which together define pneumatic chamber 106 which serves as a material reservoir for solder material 108. Preferably, the cartridge top 102 and cartridge body 104 are made from 316 stainless steel. Connected to the cartridge top 102 is a pneumatic coupling 110 which is preferably encased in a thermoplastic insulator 112. The pneumatic coupling 110 receives inert gas from the gas supply 34 which is used to pressurize the pneumatic chamber 106 and push the solder material 108 out of the cartridge 24. The cartridge body is positioned upon an actuator housing 118 that contains the vibration device 28.

The cartridge body 104 is preferably surrounded with a heater device 32 and a cartridge body insulator 116. The heater 32 enables the solder material to be melted within the cartridge 24. The heater device 32 may be implemented using any standard heater 32 known in the art which has the capability of raising the temperature above the melting point of the solder. A temperature feedback transducer thermalcouple (not shown) is provided to monitor the heater 32. The heater 32 and insulator 116 are maintained in place by standard clamping means known in the art.

The operator initiates droplet generation by activating the pneumatic system which pressurizes the solder reservoir 106, forcing the solder material 108 to flow through the orifice 132. The liquid flow rate, as described above, is a function of reservoir pressure. Prior to exiting through the orifice 132, the solder flows from the reservoir through channels 161 in the actuator housing which surround the vibration device 28 to a chamber 129 located below the vibration device. The solder flows from the chamber 129 through an acoustic wave isolation tube 130 to the orifice 132.

Acoustic energy in the form of a pressure wave is introduced into the solder 108 in the acoustic wave isolation tube 130. The acoustic pressure wave is generated by the acoustic wave generator 124 which contains the vibration device 28. The acoustic wave generator 124 is positioned in close proximity to the acoustic wave isolation tube 130. As the liquid 108 flows out through the orifice 132, the pressure wave initiates and controls the breakup of the stream into droplets 14. The droplet size and frequency is a function of the acoustic wave amplitude and frequency and the flow rate of the solder. The droplets 14 receive charge for subsequent deflection or steering at the point of the stream breakup from a droplet charge device 60.

The removable cartridge design offers the advantages of a simple and reliable method to replenish jetting material. The cartridge 24 may be sealed when filled and does not require opening by an operator, thereby ensuring contamination-free operation. The integration of the system components, ie., the pneumatic chamber 106, the pneumatic coupling 110, the heaters 32, the temperature feedback transducer thermal couple, the acoustic pressure wave generator 124, the acoustic wave isolation tube 130, the orifice 132, and the droplet charge device 60 into the removable cartridge 24 reduces the need to install and fully recalibrate the cartridge components each time a cartridge is replaced. Further, in the event of a failure, many of the critical components of the jetting system can be replaced by changing the cartridge 24 in a relatively short period of time.

Figure 6:
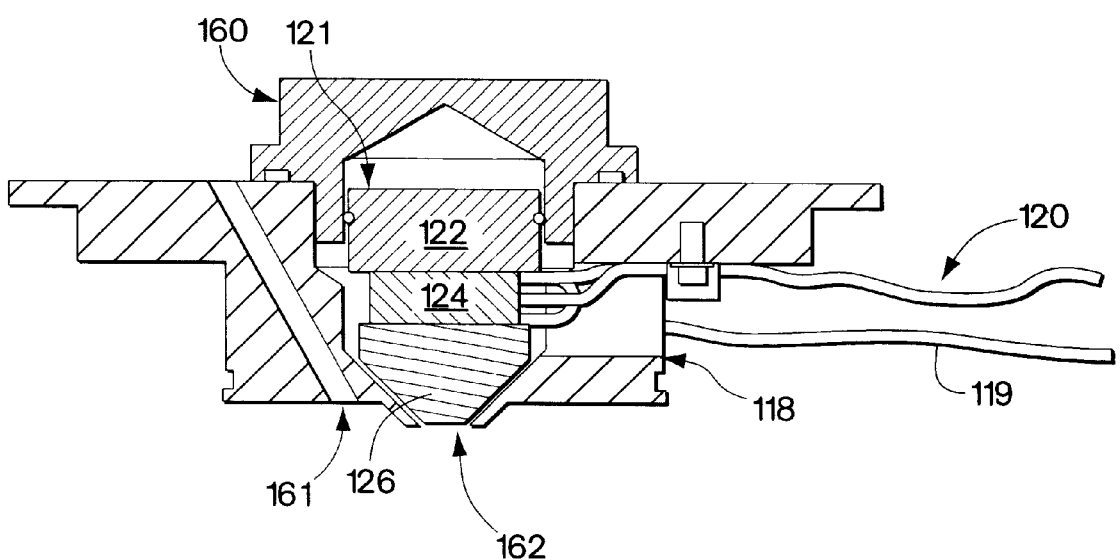
FIG. 6 is a sectional view of an actuator system of the embodiment shown in FIG. 4.

Referring to FIGS. 5 and 6, the vibration device 28 is shown in more detail. The vibration device 28 includes an actuator housing 118 and an actuator cap 160 encasing a high energy motion apparatus 121. The cap 160 may be any closure device or mechanism, including electron beam welding. The high energy motion apparatus 121 preferably includes a pressure wave generator 124, such as a piezoelectric (PZT) device, positioned between an an inertial mass 122 and a pressure wave generator. In FIG. 5, the inertial mass 122 is positioned above the pressure wave generator 124, and the energy coupling device 126 positioned beneath the pressure wave generator 124. An actuator cable 120 provides a sinusoidal voltage signal to actuate the pressure wave generator 124.

The vibration device 28 optimizes solder jetting performance by directly and cleanly coupling the acoustic energy into the molten solder stream 30 and providing controlled break up of the stream into uniformly-sized droplets 14. Energy from the vibration of the pressure wave generator 124 is transformed by the energy coupling device 126, which is preferably a conical shaped component. The preferred shape of the energy coupling device 126 allows the high frequency motion energy which is developed by the vibration device 28 to efficiently couple with the liquid solder. The conical shape helps scatter and reflect back waves. The coupling of energy to the solder is aided by the use of a diaphragm 162 which acts as a compliant membrane to allow high frequency motion generated by the vibration device 28 to couple with the liquid solder and induce a pressure wave which causes the solder to break apart controllably upon release by the orifice defining structure 26 and orifice 132. The molten solder 108 passes from the cartridge 24 towards the orifice 132 by way of at least one channel 161. The energy coupling device 126 and diaphragm 162 may be made of titanium.

In a preferred embodiment, the tip of the conical energy coupling device 126 is e-beam welded to the diaphragm 162 which allows the high-frequency motion of the transducer to acoustically couple with the solder stream 30 while it protects the transducer from the liquid solder 108. The ratio of the mass of the inertial mass component 122 to the mass of the energy coupling device 126 should be large enough to ensure a large proportion of the acoustic energy generated by the PZT 124 is directed into the liquid solder through the energy coupling component 126 and not into motion of the inertial mass 122. In one embodiment, the mass of the inertial mass component 122 is ten times that of the energy coupling component 126 to ensure that the energy is directed into the liquid solder.

By placing the vibration device 28 in close proximity to and directly over the jetting orifice 132, coupling of the high-frequency motion of the PZT actuator 124 into pressure waves in the liquid solder 108 is maximized. At the same time, unwanted acoustic noise from structural resonance and reflection is minimized.

The vibration device 28 is preferably designed to be a quasi-static device as opposed to a tuned resonance device. This allows the vibration device to operate over a fairly broad range of frequencies as limited by the resonance of the individual components. Since frequency is a prime determinant of solder sphere size and velocity, the broad range of operating frequencies provides flexibility in creating various sized solder spheres using a single apparatus.

As shown in FIG. 6, the PZT device 124 is preferably placed above the diaphragm 162 but below the inertial mass 122 in the vibration design. The inertial mass 122 and PZT actuator 124 are isolated from all components of the system except the diaphragm 162 by the actuator housing 118 and actuator cap 160. When the PZT actuator 124 vibrates, the mass of the inertial mass 122 itself, as opposed to any structural interfaces onto which the PZT 124 pushes, causes the diaphragm 162 to deflect. This combination isolates the amount of structural noise that can be passed into the vibration device 28, and hence into the stream 30.

The vibration device 28 also has the capacity to operate at high temperatures required for jetting molten metals. The PZT 124 is preferably surrounded by an air gap in the actuator housing 118 and is forced cooled by actively flowing compressed nitrogen through the air gap (not shown) to keep the PZT temperature below a point where PZT degradation occurs. The compressed nitrogen can be flowed through a tube 119.

The design of the vibration device 28 provides the advantages of delivering a repeatable, consistent deflection of the diaphragm 162 for a given PZT excitation while remaining essentially independent of the structural resonances and noise of the base apparatus.

Figure 7:
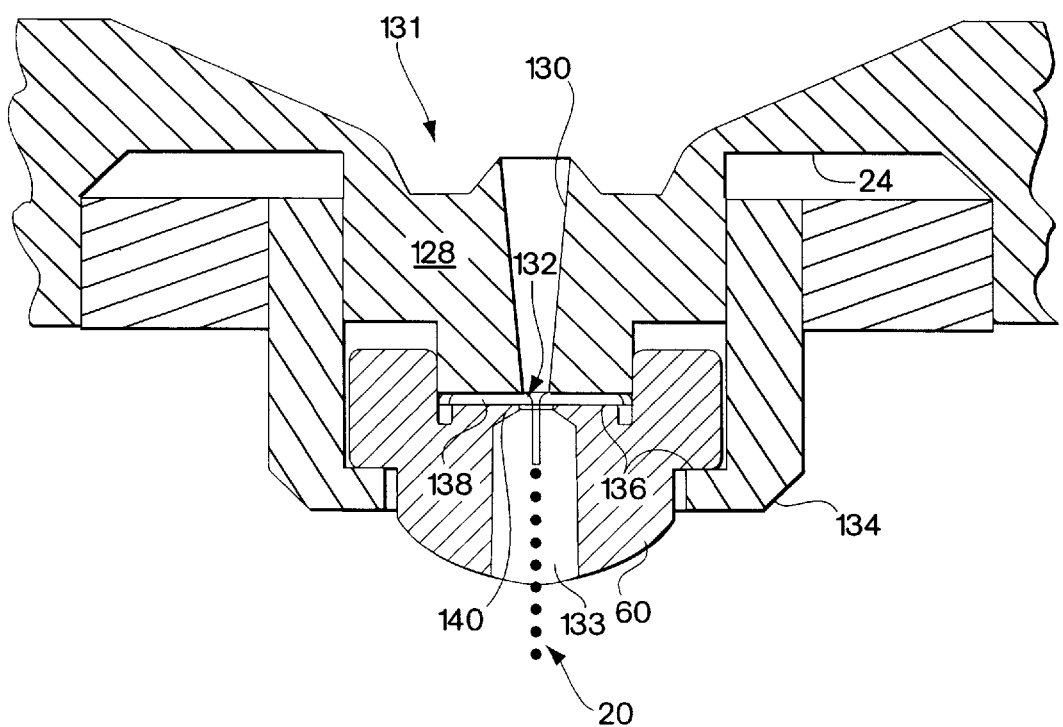
FIG. 7 is a sectional view of a charge device of the embodiment shown in FIG. 4.

Referring now to FIGS. 5 and 7, the orifice defining structure 26 and charge device 60 can be seen in greater detail. Molten solder material 108 is received in a chamber 129 beneath the vibration device 28. The chamber 129 is preferably designed so that a recessed ring 131 surrounds the wave isolation tube 130, with the wave isolation tube 130 protruding above the center of the ring 131. This design prevents the pressure wave from the diaphragm 162 from reflecting back into the vibration device 28 or into the solder 108 in the wave isolation tube. Excess energy from the pressure wave is diverted away from the wave isolation tube 130.

The orifice defining structure 26 includes the orifice mount 128, the wave isolation tube 130, the orifice plate 138 and the orifice 132. The orifice mount 128 is positioned beneath the actuator housing 118 and has a wave isolation tube 130 preferably formed by electro-displacing machining and polishing. When assembled, the orifice mount 128 is positioned relative to the actuator device 28 so that wave isolation tube 130 is in alignment with the high energy motion apparatus 121. The acoustic wave isolation tube 130 is preferably shaped in such a way as to minimize the effects of reflected acoustic noise from the vibrator device 28. As the molten solder 108 reaches the wave isolation tube 130, it will receive acoustic energy in the form of a pressure wave before traveling to the orifice plate 138 and the orifice 132. An alternative design for the wave isolation tube 130 can be a cylindrical shaped tube.

Figure 8A:
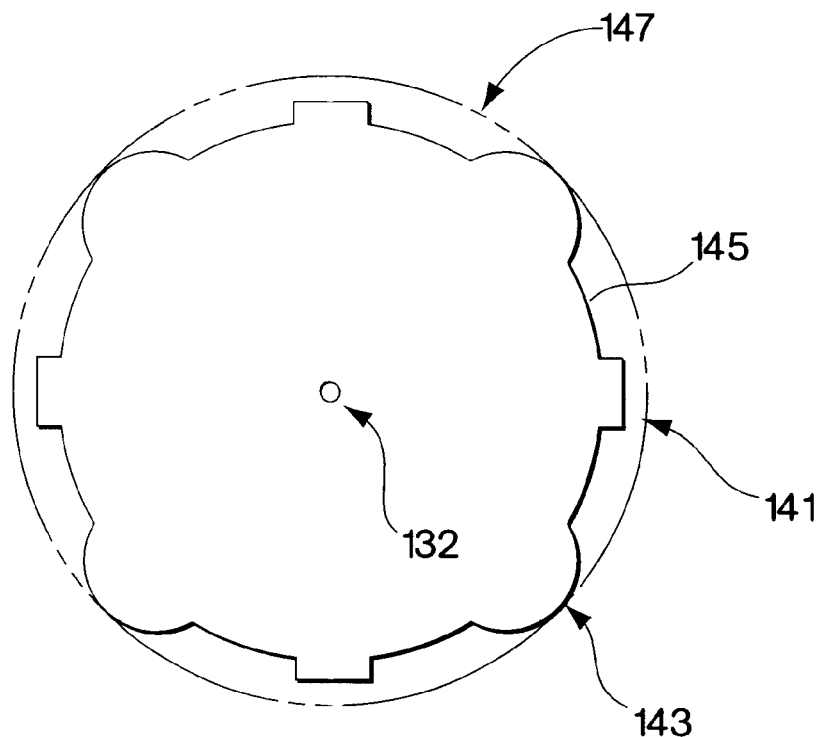
FIG. 8A is a top view and FIG. 8B is a sectional view of an orifice plate of the embodiment shown in FIG. 4.
Figure 8B:
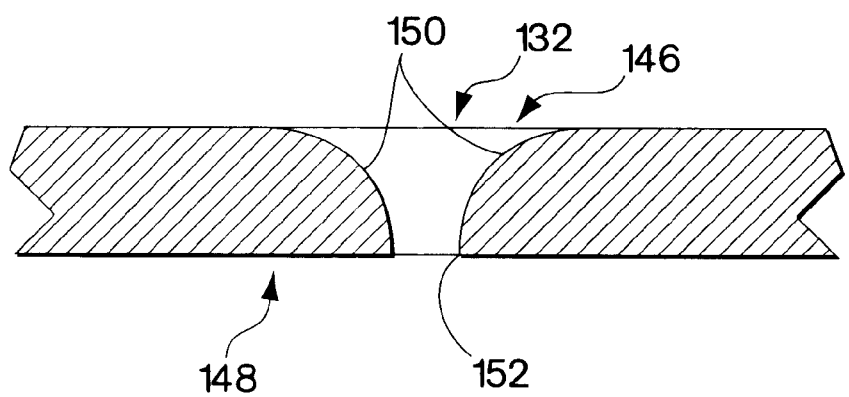

Referring to FIGS. 8a and 8b, a preferred design of the orifice plate 138 can be seen in greater detail in both a top view (FIG. 8a) and a side view (FIG. 8b). The orifice plate 138 has an entrance side 146 and an exit side 148. This orifice plate is preferably 0.007–0.009" thick. The orifice 132 is preferably centrally positioned on the orifice plate 138. A plurality of centering tabs 143 ensures that the orifice 132 is precisely centered when the cartridge 24, orifice 132, and charge device 60 are assembled.

The orifice 132 is preferably contoured differently on the entrance side 146 than on the exit side 148 of the orifice plate 138 to deliver a consistent and controlled stream of liquid 30 by utilizing a combination of surface geometry and coatings. On the entrance side 146, the orifice 132 has a radiused edge 150 with a smooth line of curvature. On the exit side 148, the orifice 132 is preferably designed with a sharp cut off edge 152. The coating, preferably chromium, provides a solid non-wetting surface between the jetted solder liquid 30 and the orifice 132.

The sharp exit edge 152, in combination with the influence of the non-wettable chromium coating, allows the jetted solder material 30 to break away from the orifice 132 uniformly and make the jetted solder material stream directionally stable. The radiused side 146 allows the column of jetted material 30 leaving the orifice 132 to have a uniform velocity profile. Further, small impurities in the jetted solder material which collect on the entrance side of the orifice 132 create disturbances to the solder material flow. The radiused shape helps to minimize the disturbances caused by these impurities.

The orifice 132 is preferably made by electro-forming the base shape and sputtering the base with a thin coating of chromium, preferably 2000–3000 Angstroms. Preferably, the orifice plate 138 is nickel cobalt (less than 5% cobalt) chromium coated with the entrance side 146 facing the cartridge 24. The diameter of the stream of jetted solder material is controlled by the size of the opening 132 in the orifice plate 138.

Referring back to FIGS. 5 and 7, the charge device 60 can be seen in greater detail. The charge device 60 defines a charge chamber 133 which receives a solder stream 30 from the orifice 132 of the orifice plate 138. The energy from the pressure wave generator 124 causes the solder stream 30 to break into droplets 14 which receive an electric charge within the charge chamber 133. The charge device 60 further includes an electrical isolation layer 136 that surrounds the sides and the top of the charge device 60 to prevent electrical contact between the charge device 60 and the actuator housing. The charge device 60 is positioned beneath the orifice plate 138 and the orifice mount 128 and may be fastened by clamping devices 134 known in the art.

In operation, once a jetting stream 30 is established, the droplet charging device 60 is activated. A charge pulse of controlled voltage, duration, and phase is applied to the charge device 60. This charge pulse is generated by the electric charging supply 42 and is controlled by the controller 44. Droplets 14 receive charge through an electric field that is developed between the charge device 60 and the solder material 30. This charge remains with the droplet 14 as the droplet 14 is separated or "broken" from the conductive stream 30.

A uniform electric field is achieved by the charge device 60 preferably by incorporating a "winn" 140 into the design of the charge device by tapering the end of the charge device 60. The winn 140 is used to truncate the fringing electric fields normally associated with an open ended or straight ended charge tube or cylinder.

Figure 9:
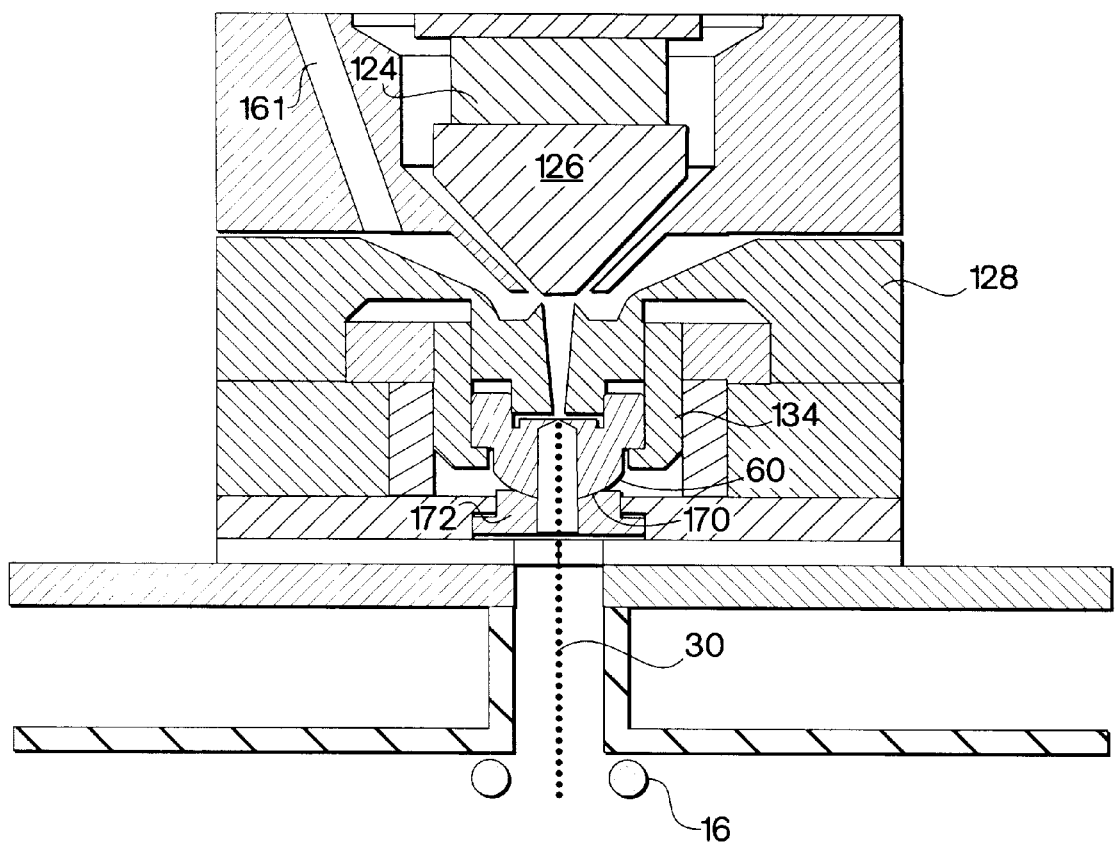
FIG. 9 is a sectional view of the charge device with a spherical interface.

In a preferred embodiment shown in FIG. 9, a conductive spherical interface 170 is provided between the end of the charge device 60 and the receptor 172 (preferably, spring actuated). The spherical interface 170 allows pivoting freedom for stream direction control and provides electrical connection for droplet charging. The charge tube 60 remains in contact with the drive electronics even as the entire environmental chamber 62 and cartridge 24 are rotated in space to adjust the jet direction. The electric charging supply 42 is electrically coupled to the receptor 172, and the charge device receives the charge pulses from the receptor through the conductive interface 170.

The charge tube design offers the advantages of delivering consistent charge to enable successful printing by the jetting system. The charge tube 60 geometry also offers the advantage of delivering a robust electrical connection during gimbal pivoting.

From the charge device 60, the charged solder droplets 14 enter into the environmental chamber 62. In the environmental chamber, jetted solder material is kept in an inert environment which is free of disturbances which could cause errors in the location of the solder droplets 14 on the substrate 22. The environmental chamber 62 also provides for the removal of solder material which is not used for deposition onto a substrate. Unused solder material is removed from the protected environment and deposited into a catch reservoir 66. In this manner, the solder material is removed without disturbing the steady state of the stream 30.

In a preferred embodiment, the environmental chamber 62 provides an inert controlled atmosphere for the stream 30. The environmental chamber 62 accomplishes this by appropriately sealing the environment and by providing a laminar flow of inert gas through a diffuser 40. Flow of inert gas out of the diffuser 40 is preferably at a velocity of about 1 cm/sec. A positive pressure, preferably higher than ambient, is maintained in the environmental chamber 62 to reduce the chance of oxygen migration into the chamber 62. The inert gas escapes the environmental chamber 62 through the print slot 68 and also through the catch chute 64. A ground plane 21, as described below in greater detail, can be used in conjunction with the print slot 68 to ensure positive pressure in the environmental chamber.

In one embodiment, the body of the environmental chamber 62 contains a plurality of temperature control air ducts. These air ducts prevent temperature gradients from developing within the environmental chamber 62 by maintaining a constant flow of air through the body of the environmental chamber.

Nitrogen or other inert gas is provided from the gas delivery system to the environmental chamber at three locations. First, as stated above, a flow of inert gas enters the environmental chamber 62 above a diffuser 40, which distributes the gas and creates a laminar flow in the area in which the molten stream 30 travels. Second, gas is also introduced into the environmental chamber 62 by a nozzle located at the interface between the cartridge 24 and the environmental chamber 62. Third, as discussed further below, gas is also used to create a venturi effect in the catch chute 64.

The catch chute 64, a collection device 20, and the print slot 68 are designed to prevent the introduction of turbulence in the flow of the gas through the environmental chamber. The print slot in one embodiment has an opening the size of which is approximately 5–10 cm×½–1 cm.

The collection device 20 preferably includes a catch chute 64 and a reservoir 66. The catch chute 64 removes jetted solder material from the bottom of the environmental chamber 62 without affecting the integrity or the flow of the jetted solder stream 30 to be deposited on the substrate 22. The design of the catch chute allows the removal of solder material without introducing thermal or pneumatic gusts into the interior of the environmental chamber 62. The catch chute 64 in a preferred embodiment is also designed to prevent external oxygen and other contaminants from entering into the environmental chamber 62.

In an alternative embodiment, the catch chute 64 can be pulled out away from the solder stream either manually or through the use of mechanical/electrical devices known in the art. After being pulled out, the catch chute 64 can be replaced with another chute or cassette. The pull out catch chute 64 may contain heaters integrally attached. Inert gas flows in one side of the catch chute 64 and exits at a second end.

The solder material stream 30 enters the catch chute 64 through a slot or opening on the top of the catch chute 64. The catch chute 64 is heated to assure that the molten solder material continues to flow and does not freeze. Preferably, the catch chute is a gravity fed, heated/insulated trough made of a Teflon hard-coated aluminum. The catch chute 64 includes a blade which separates the deflected stream of material 30 from the stream to be deposited on the substrate. Preferably, this blade is a knife-edge molybdenum blade which minimizes material sticking to the blade.

A venturi nozzle 65 is located at the outside end of the catch chute 64 to induce an outward flow of gas from the catch chute at a desired rate and thereby prevent oxygen and other contaminants from entering the environmental chamber 62. Molten solder material 30 flows down the chute 64, through the venturi nozzle 65 and is then deposited in a reservoir 66 for recycling. The nitrogen gas surrounds the solder as it is deposited in the catch chute 64 to prevent oxidation of the solder to enable it to be recycled for use.

As the flow of gas exits from the environmental chamber 62, the flow rate accelerates onto the substrate 22 and ground plane. Preferably, the ground plane 21 includes a recessed area in which the substrate 22 rests. This allows the top surface of the substrate to align approximately level with the top surface of the ground plane. In this embodiment, gas flow from the environmental chamber 62 escapes off the sides of substrate 22 as the substrates 22 pass through the soldering system 10.

The reservoir 66 is preferably made with a heated Teflon hard-coated aluminum material. The reservoir 66 resides on the exterior of the environmental chamber 62 to prevent the introduction of thermal currents from the heated solder into the environmental chamber.

The deflection device 16 is located in the environmental chamber preferably directly below the diffuser 40. In a preferred embodiment, the deflection device 16 includes a pair of deflection plates 16a and 16b, and a voltage potential is created between the plates 16a and 16b using the deflection field supply 45. In one embodiment, one of the plates is raised to a voltage of approximately +3000 volts and the other of the plates is lowered to a voltage of approximately −3000 volts to provide a voltage differential of 6000 volts between the plates. It should be noted that the deflection plates can be either electro-static or electromagnetic.

As will be more thoroughly described below, a vision alignment system 49 is used in conjunction with the controller 44 to monitor the positions of the droplets in the stream 30 and send commands to the gimbal assembly 58 to provide proper alignment of the nominal undeflected stream.

The alignment system 49 and the gimbal system 58 will now be described with reference to FIGS. 1, 4 and 10. As the solder droplets 14 fall through the environmental chamber 62, the positions of the solder droplets 14 are monitored by CCD cameras 50 and 52, each of which has a corresponding strobe light 70 and 72. Alternatively, the cameras 50 and 52 can be line scan cameras that use DC lights in place of the strobe lights. Camera 50 provides feedback to the controller 44 about the position of the jetting stream 30 along the X-axis. This information is used to keep the jetting stream aligned along the vertical Z-axis, and in one embodiment of the invention to control the velocity of the jetted stream. In one embodiment, the cameras 50 and 52 and the environmental chamber 62 rotate together to provide the fan axis described above.

Camera 52 provides feedback to the controller 44 regarding the position of the jetting stream along the Y-axis to keep the jetted stream 30 aligned along the vertical Z axis. The camera 52 also provides deflection data for phase and deflection calibration purposes.

The strobe lights 70 and 72 are synchronized to the PZT frequency (with the PZT frequency being an even multiple of the strobe light frequency) to optimize the viewing of the individual droplets 14 in the jetting stream 30. An optional third camera (not shown) and strobe light may be positioned below camera 52 to monitor the edge of the collection device and the Y-axis of the jetting stream 30. The output from the third camera may be displayed on a monitor (not shown). Each of the cameras and strobe lights are mounted external to the environmental chamber 62 adjacent transparent windows to provide viewing into the environmental chamber.

The jetting system 10 also includes a substrate alignment system that includes a substrate viewing camera 54 for locating a fiducial mark on the substrate and relaying this information to the controller 44 to allow the controller to properly position the substrate in the jetting system prior to the jetting of material onto the substrate. The viewing camera 54 may also be used as an inspection and calibration device to view the droplets after they have been dispensed onto the substrate.

The gimbal assembly 58 preferably comprises three moveable sections 200, 204, and 208. Each of these sections 200, 204 and 208 is preferably controlled by a respective motor device 202, 206, and 210. The controller 44 controls each of the motors 200, 204 and 208 to provide proper alignment of the jetted stream.

The three sections, 200, 204 and 208, are preferably positioned concentric to each other and therefore, about a common Z-axis. The removable cartridge 24 is mounted to the innermost section 208 with the orifice 132 positioned on the Z-axis. Each of the sections 200, 204 and 208 may move individually or in cooperation with both of the other sections. By using the gimbal system 58 as a mount for the cartridge 24, the direction of the solder stream 30 can be controlled during jetting.

Figure 10:
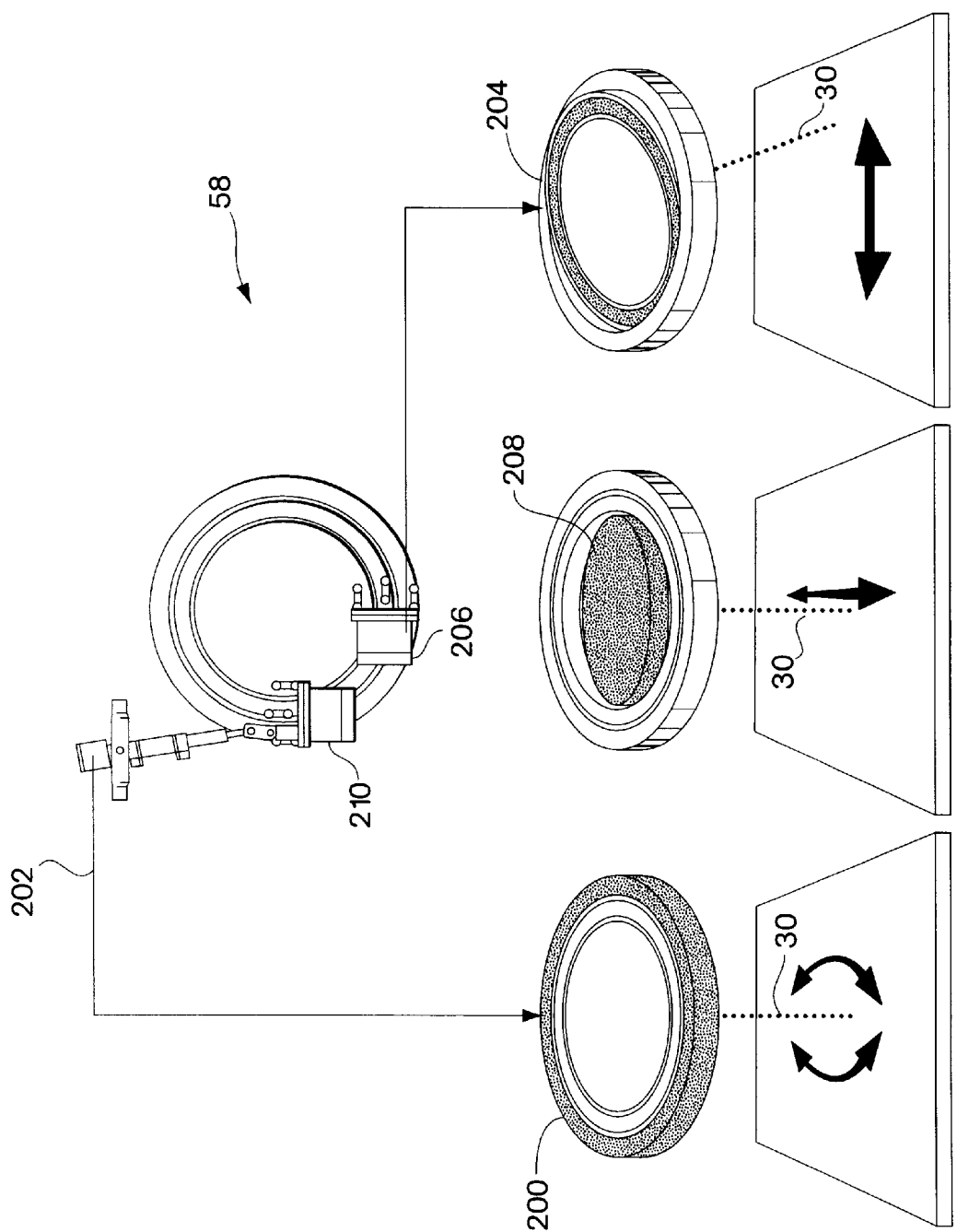
FIG. 10 is a schematic illustration of a gimbal system of the embodiment shown in FIG. 4.

Referring to FIG. 10, the outermost section 200, in a preferred embodiment, is rotated by motor 202 to rotate the solder ejector 12 and the deflection device 16 to provide a proper offset axis between the substrate and the deflection device. In one embodiment, the maximum range of rotation is limited to approximately 45 degrees.

The second section 204 is controlled by motor 206 to provide adjustment of the jetted stream in the X-axis direction. The motor 206 tips the second section 204 over a range of +/−1.5 degrees to move the solder stream 30 along the X-axis.

The third section 208 is controlled by motor 210 to provide adjustment of the jetted stream along the Y-axis. The motor 208 tips the second section 204 over a range of +/−1.5 degrees to move the solder stream 30 along the Y-axis.

In an alternative embodiment of the gimbal system 58, motor 202 rotates the environmental chamber 62 while the solder ejector position remains fixed to provide the offset axis between the substrate and the deflection device. In this embodiment, the position of camera 50 remains fixed, while camera 52 rotates with the environmental chamber 62.

Controls

Embodiments of the solder jetting systems described above utilize several control systems to effectively control the stability and performance of the system. These control systems provide calibration of the system prior to the jetting of material onto a substrate as well as real-time closed loop control during the jetting process. The controller 44 provides the primary processing functions of the control systems. In one embodiment of the present invention, the controller 44 is implemented using a personal computer, based on the Intel® Pentium Processor, in conjunction with a Cognex 5000 Vision Processor. The personal computer is appropriately programmed to provide the control functions described below. The control systems include 1) a vertical alignment control system, 2) a pressure/velocity control system, 3) a phase control system, and 4) a deflection control system. Each of these control systems is described in greater detail below.

Vertical Alignment Control System

To properly jet solder droplets onto precise targets on a substrate, the jetted stream of solder droplets in a non-charged state must be precisely aligned along a desired Z-axis line of the system. The desired Z-axis line is vertical to the ground, equidistant from each of the deflection plates 16a and 16b, and passes through the center point of the orifice 132. In the absence of a vertical alignment system, the jetted stream may vary from the desired Z-axis line due to several effects including thermal expansion caused by the heating of the solder in the cartridge.

Embodiments of the present invention align the jetted stream of solder droplets to the desired Z-axis line using the gimbal assembly described above. The gimbal assembly provides rotation of the cartridge 24 along orthogonal X and Y axes that intersect at a pivot point located at the center of the orifice. Each of the X and Y axes are perpendicular to the desired Z-axis line.

Cameras 50 and 52 in conjunction with the controller 44 are used to monitor the position of the jetted stream with respect to the desired Z-axis. Camera 50 is used to detect any deviation of the jetted stream in the X-axis direction, and camera 52 is used to detect any deviation of the jetted stream in the Y-axis direction.

Figure 11:
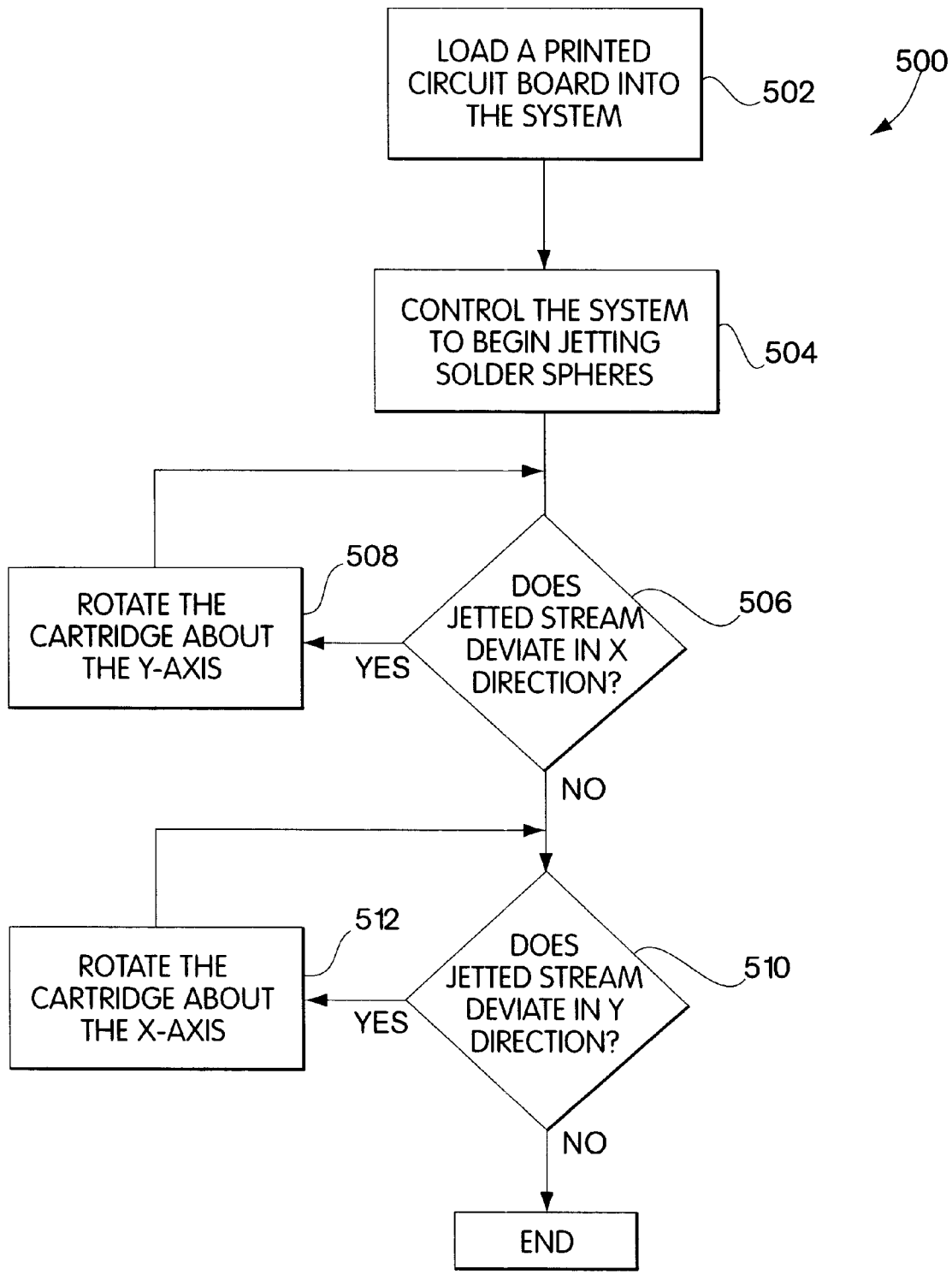
FIG. 11 is a flow chart describing the operation of a vertical alignment control system in accordance with one embodiment of the present invention.

The operation of the vertical alignment control system in accordance with one embodiment of the present invention will now be described with reference to FIG. 11 which shows an alignment process 500. In this illustrative embodiment, alignment of the jetted stream is performed each time a printed circuit board is loaded into the system. In step 502, a printed circuit board is loaded into the system. The jetting system is then controlled by the controller 44 to begin jetting solder droplets from the cartridge (step 504). During the vertical alignment process, there is no voltage applied to the charge device 60, and therefore, the solder droplets are not charged by the charge device and are not deflected by the deflection plates. Thus, during the vertical alignment process, the solder droplets land in the catch chute 64.

In step 506, using camera 50, the controller determines whether there is any deviation of the jetted stream 30 from the desired Z-axis line in the X-axis direction. If any deviation is detected, then in step 508, the controller 44 controls motor 206 to rotate the cartridge about the Y-axis to correct the deviation. Steps 506 and 508 are repeated in a closed loop fashion until the result of decision block 506 is "yes" indicating that there is no deviation of the jetted stream from the desired Z-axis line in the X-axis direction.

In steps 510 and 512, any deviation of the jetted stream 30 in the Y direction is corrected in a manner similar to steps 506 and 508 described above, except that camera 52 and motor 210 are used to detect and correct the deviation. When the result of step 510 is "yes", the vertical alignment process is complete.

In the vertical alignment process described above, alignment in the X and Y directions are described as occurring sequentially, with correction of any deviation in the X direction occurring first. In alternate embodiments, correction in the Y direction may occur first, or correction in the X and Y directions may occur simultaneously. The vertical alignment process is described above as occurring each time a printed circuit board is loaded into the system, however the process may be repeated more or less frequently, as necessary.

Pressure/Velocity Control System

The pressure/velocity control system is used to maintain the pressure of the solder at the orifice to a predefined value. As described above, the velocity of the jetted stream is proportional to the square root of the pressure difference of the solder above and below the orifice. In the absence of a pressure control system, the pressure difference at the orifice would decrease as the level of solder in the cartridge 24 decreases, resulting in a decrease in the velocity of the jetted stream 30.

Figure 12:
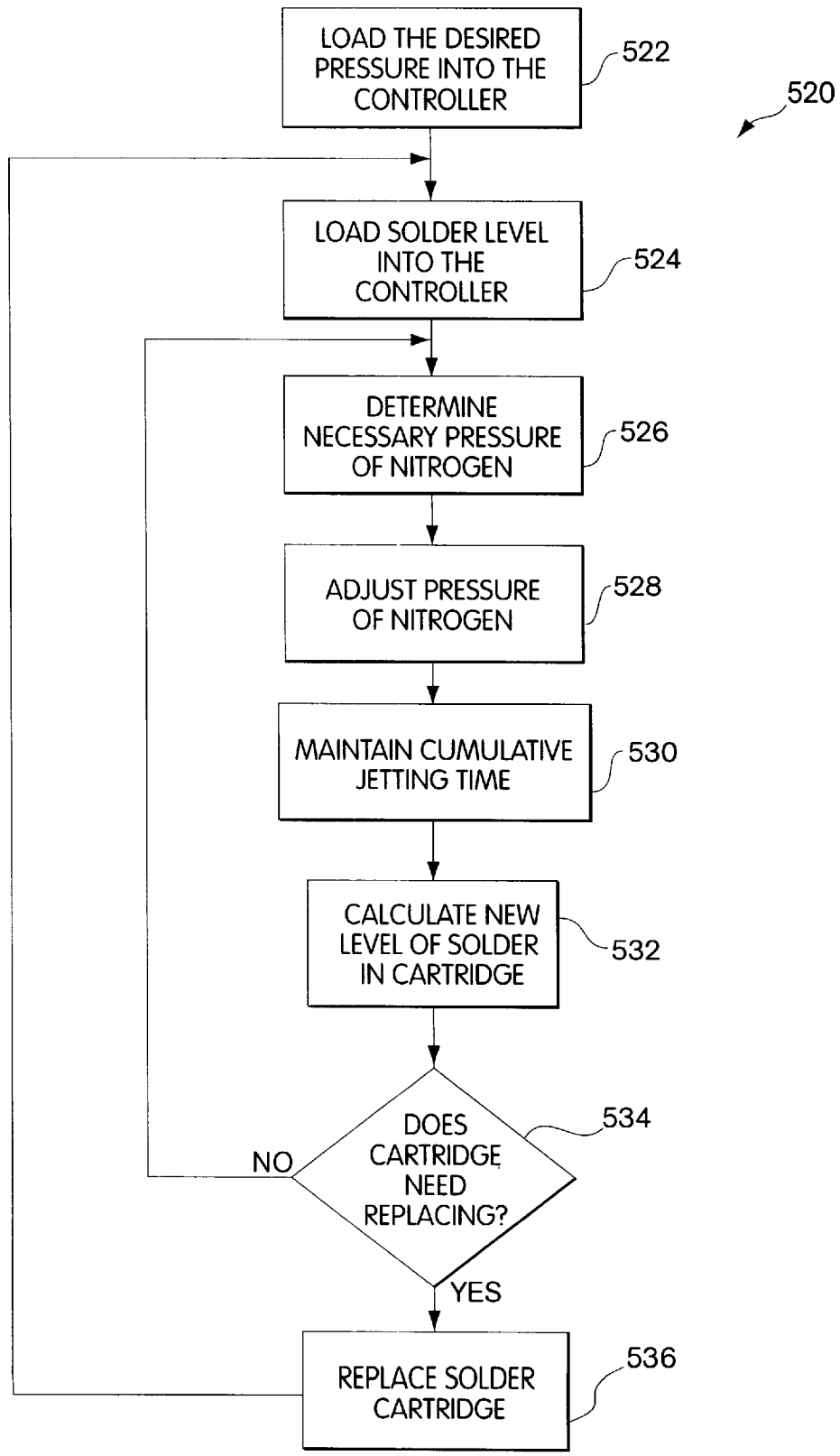
FIG. 12 is a flow chart describing the operation of a pressure/velocity control system in accordance with one embodiment of the present invention.

In one embodiment of the present invention, the controller 44 controls the pressure at the orifice by increasing the pressure of the nitrogen supplied to the cartridge based on the amount of solder used by the system. The pressure of the nitrogen is adjusted by the controller using the regulator 35a. The pressure control process 520 will now be described with reference to FIG. 12. Prior to jetting solder, the desired pressure at the orifice 32 is loaded into the controller 44 (step 522), and the level of solder in the cartridge is also loaded into the controller (step 524). In step 526, the controller uses the level of solder in the cartridge, along with predetermined calibration factors for the cartridge, to determine the pressure of nitrogen necessary to provide the desired pressure at the orifice. The predetermined calibration factors provide a correlation between height of solder in the cartridge and pressure at the orifice. In step 528, the controller adjusts the regulator to provide the nitrogen pressure determined in step 526.

In step 530, the controller maintains a cumulative jetting time of the system. The cumulative jetting time equals the total amount of time during which the jetting system has been jetting solder droplets 14. This cumulative jetting time is reset each time the solder cartridge 24 is replaced and the initial level of solder is entered into the controller 44.

In step 532, the system calculates a new level of solder in the cartridge based on the cumulative jetting time of the system. Since the system continuously jets solder at a known mass flow rate frequency, the amount of solder used, and therefore, the level of solder in the cartridge 24 can be determined based on the initial level of the solder and on the cumulative jetting time. In step 534, the system determines whether the solder level is sufficiently low so that the cartridge should be replaced. If the outcome of decision block 534 is "yes", then the controller provides an indication that the cartridge must be replaced. The cartridge is then replaced in step 536, and the process repeats again starting with step 524.

If the outcome of decision block 534 is "no", then the required pressure of the nitrogen for the new level of solder in the cartridge is determined in step 526, and the pressure of the nitrogen is adjusted in step 528. The process then continues with step 530 as described above.

Figure 13:
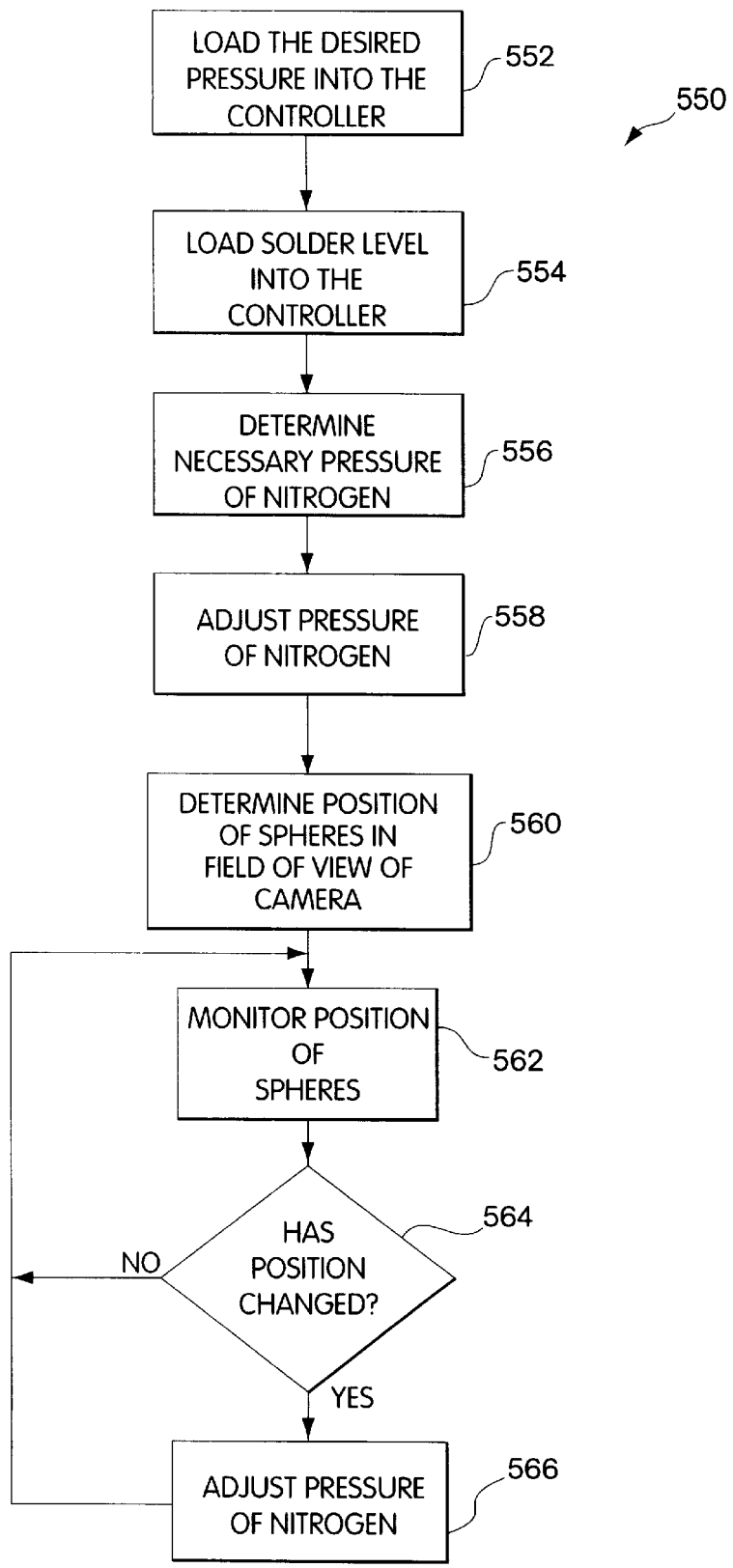
FIG. 13 is a flow chart describing the operation of an alternate pressure/velocity control system in accordance with one embodiment of the present invention.

In an alternate embodiment of the present invention, a closed-loop pressure control system is provided. In this alternate embodiment, the velocity of the solder droplets 14 is monitored, and the pressure of the nitrogen gas is controlled based on any changes in the velocity. The closed loop pressure control process 550 of this embodiment will be discussed further with reference to FIG. 13. Steps 552, 554, 556 and 558 of process 550 are identical to steps 522, 524, 526 and 528 of process 520 discussed above. In step 560 of process 550, the position of the solder droplets 14 appearing in the field of view of camera 50 is determined using the camera 50 and the controller 44. The position of the solder droplets on the screen is stored by the controller. As discussed above, the frequency of the droplets is an even multiple of the strobe frequency of strobe light 70. Thus, when the frequency and velocity of the solder droplets remain constant, then the position of solder droplets 14 in the field of view of camera 50 will also remain constant.

In steps 562 and 564, the camera and the controller continue to monitor the position of the solder droplets 14 in the field of view of the camera, until the controller detects that the position of the solder droplets 14 has changed more than a predefined limit. The change in the position of the droplets indicates that the frequency and/or velocity of the solder droplets 14 has changed requiring a change in nitrogen pressure. In step 566, the controller controls the regulator 35a to adjust the pressure of the nitrogen, and then the system resumes monitoring of the position of the droplets 14 in steps 562 and 564. The closed-loop process 550 will result in the nitrogen pressure being increased as the level of solder in the cartridge 24 is decreased.

In some embodiments of the present invention that use the closed-loop pressure control system described above, the controller is also programmed to monitor solder level in the manner described above for the embodiments of the invention that use the time-based pressure control system. This enables the controller to provide an indication of the solder level to an operator of the jetting system.

Phase Control System

Embodiments of the present invention use a phase control system to ensure that the timing of the pulses to the charge device 60 is synchronized with the dispensing of solder droplets from the cartridge. This control process is achieved empirically during a calibration process that typically occurs prior to the jetting of solder onto each substrate, and after the vertical alignment system has aligned the jetted stream along the desired Z-axis line.

As described above, each solder droplet receives a charge from the charge device 60 immediately prior to its breaking away from the stream of solder 30 jetted from the orifice 132. The charge device is driven by a pulsed charge signal having a frequency synchronized to the frequency of the sinusoidal signal used to drive the piezoelectric transducer 124. The pulsed charge signal has approximately a 50% duty cycle, a pulse width $P_c$ and a magnitude that is adjustable between +/−300 volts based on the desired deflection of the solder droplets. In one embodiment of the present invention, as shown in FIG. 4, when the magnitude of the pulses is less than zero, solder droplets are deflected through the print chute 68; when the magnitude of the pulses is greater than zero, solder droplets are deflected into the catch chute 64; and when the magnitude equals zero, the solder droplets remain along the Z-axis and land in the catch chute 64. Similarly, one of skill in the art will appreciate that by varying the location of the catch chute 64 and/or print chute 68, the relationship to the pulse magnitude changes. For example, if the catch chute 64 is located opposite the position shown in FIG. 4, solder will be deflected into the catch chute 64 when the magnitude of the pulses is less than or equal to zero. In this case, solder will be deflected into the print chute 68 when the magnitude of the pulses is great than zero.

Figure 14:
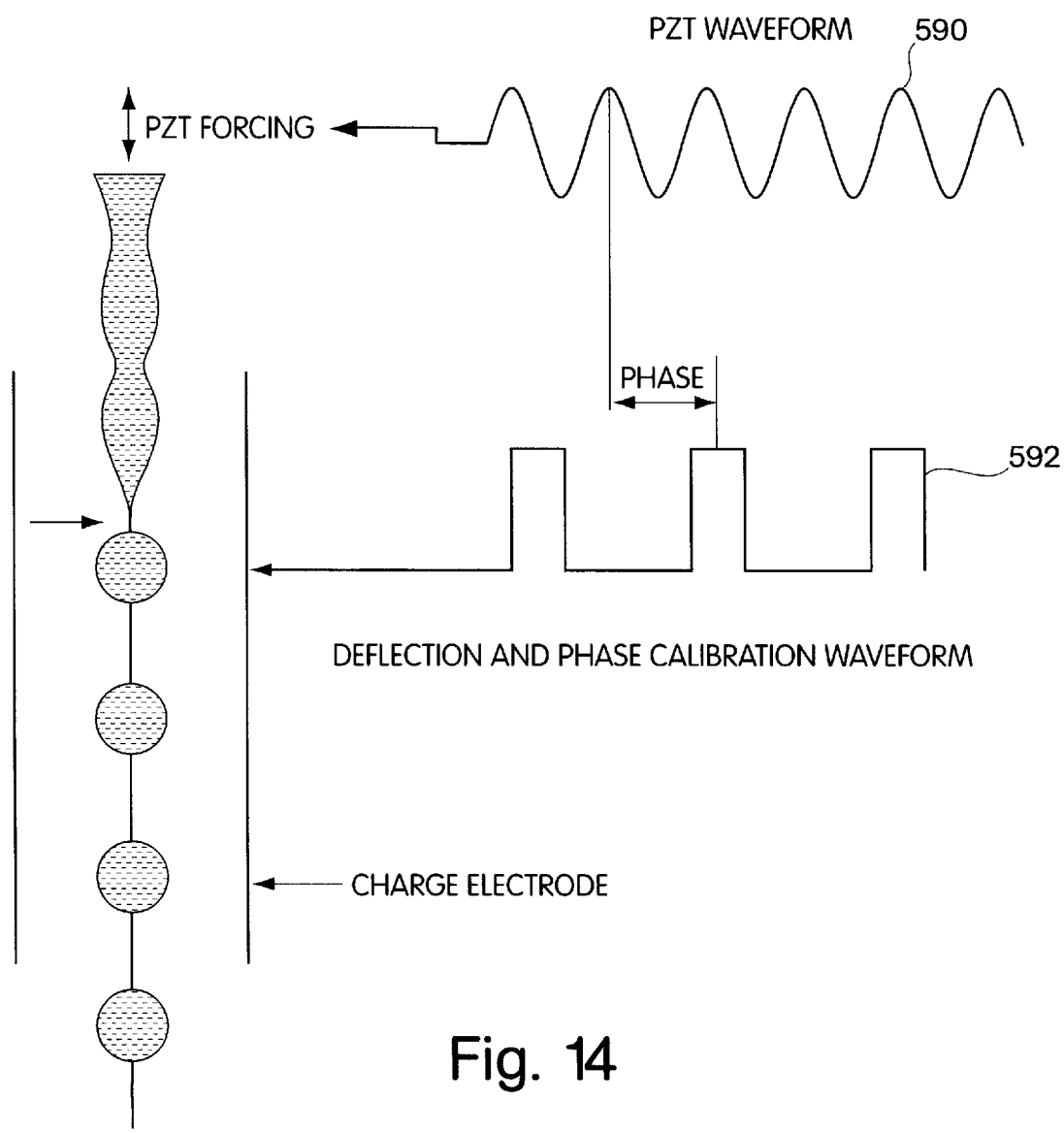
FIG. 14 is a schematic illustration of a piezoelectric (PZT) wave form and a charge pulse signal in accordance with one embodiment of the present invention.

For optimum charging of the solder droplets 14 in the charge device 60, the phase relationship between the signal used to drive the piezoelectric transducer and the pulsed charge signal must be adjusted to provide the proper phase lag to the charge signal. The phase lag is necessary because of the time required for a sound wave to travel from the piezoelectric transducer to the breakup point of the stream. The difference in phase between the signal 590 used to drive the piezoelectric transducer and the charge signal 592 is illustrated in FIG. 14.

Each solder droplet passing through the charge device has an effective charging period equal to the time during which it will effectively receive a charge from the charge device 60. This time period begins when the solder droplet starts to form in the charge device, causing the electrical impedance between the solder droplet and the remaining solder in the cartridge 24 to increase. This time period ends when the solder droplet 14 breaks away from the stream 30.

The effective charging period is less than the pulse width of the charging signal, and the objective of the phase control system is to align the center of the effective charging period with the center of the charging pulse. This allows for slight variations in the break up point of the jetted stream 30, and thus slight variations in the effective charging period, without causing variations in the charge placed on the solder droplets 14.

Figure 15:
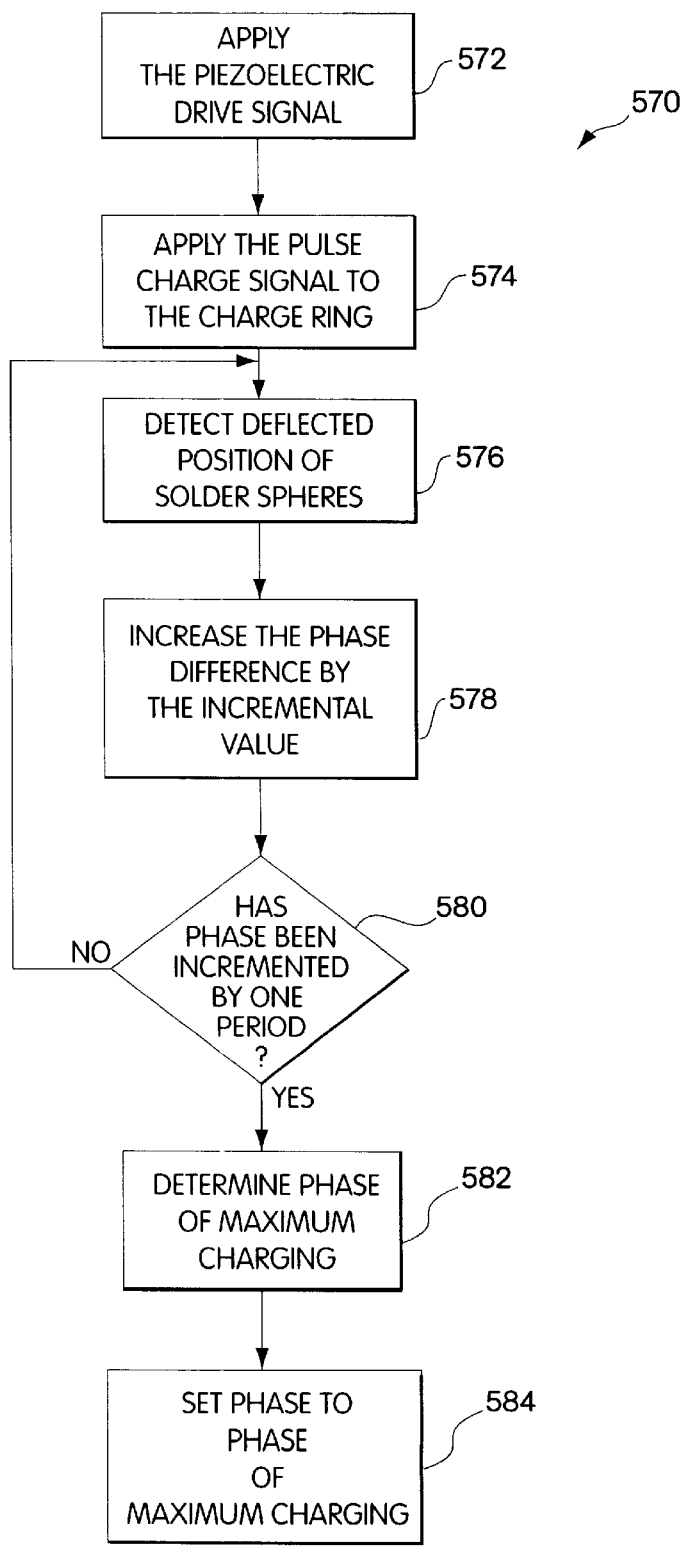
FIG. 15 is a flow chart describing the operation of a phase control system in accordance with one embodiment of the present invention.
Figure 16:
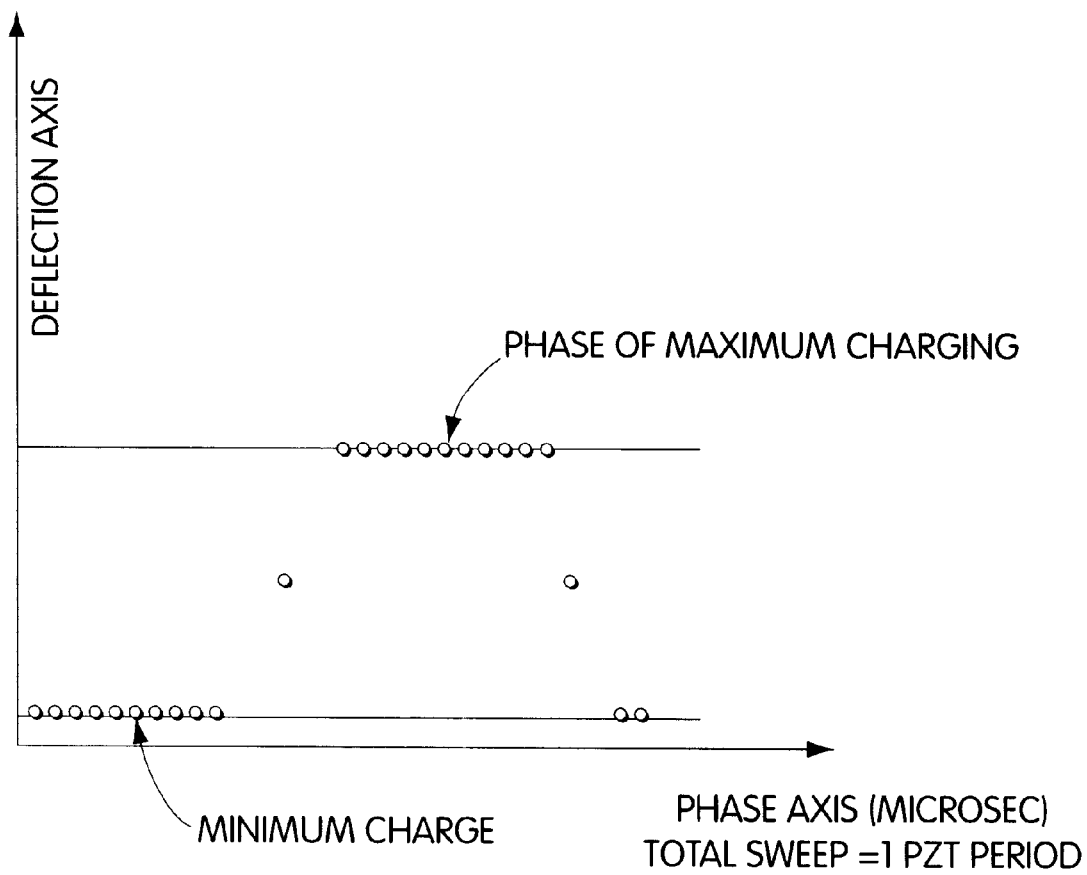
FIG. 16 is a graph showing relative deflection of solder spheres vs. phase of the charge pulse signal in accordance with the phase control system described in the flow chart of FIG. 14.

The operation of the phase control system in one embodiment of the present invention will now be described with reference to FIG. 15, which shows a phase control process 570. The process 570 begins with the application of the piezoelectric drive signal (step 572). The pulse charge signal 592 shown in FIG. 16 is then applied to the charge device (step 574), with the phase difference between the piezoelectric drive signal and the pulse charge signal being set to an initial predetermined value. The initial predetermined value of the phase difference may be based on a previous phase calibration of the system. As shown in FIG. 14, the pulse charge signal is set to apply a pulse of maximum magnitude to the charge device 60 at a frequency that is one-half the frequency of the jetted solder droplets. Thus, when the pulse charge signal is in proper phase alignment, every other solder droplet will receive a charge and be deflected by the deflection plates. By deflecting every other droplet, a nominal (uncharged) stream as well as a deflected stream may be detected by the viewing system. The magnitude of the pulse charge signal is equal to or greater than zero during the phase control process, so that all of the jetted solder droplets are jetted into the catch chute 64.

In step 576, the position of the deflected solder balls along the deflection axis is determined using camera 52, strobe light 72, and the controller 44. The value of the phase difference is then increased by a predetermined value in step 578. In one embodiment of the invention, this predetermined value is equal to ¹⁄₂₅th of the period of the piezoelectric drive signal. In step 580, the controller determines whether the difference between the present phase difference and the initial phase difference is equal to the period of the piezoelectric drive signal. This will occur after the phase difference signal has been increased twenty-five times. If the result of decision block 580 is "no", then the deflected position of the solder droplets for the present phase difference value will be determined in step 576, and the phase difference will again be increased in step 578.

If the result of decision block 580 is "yes", indicating that the phase difference has been incremented through one complete period of the piezoelectric drive signal, then the phase of maximum charging is determined by the controller in step 582 as follows. The camera and controller, in step 576, have detected and recorded the deflected position of the solder droplets 14 for each of the incremental phase differences. FIG. 16 shows a graph of the detected deflected position of the solder droplets at each of the incremental phase differences. The phase of maximum charging is equal to the midpoint 594 of the maximum deflection range as shown in FIG. 16. In step 584, the phase difference between the piezoelectric drive signal and the pulse charge signal is set equal to the phase of maximum charging, thereby providing proper alignment of the phase of the charging signal with the breakup point of the stream. As discussed above, this phase alignment is relatively insensitive to small changes in the phase of the stream.

Deflection Control System

Embodiments of the present invention include a deflection control system 30 that calibrates the level of charge that must be applied to the solder droplets 14 in the stream 30 to provide a given level of deflection. The deflection control calibration is performed prior to jetting solder droplets onto each substrate and after both the phase control calibration and the vertical alignment control calibration. The deflection calibration can be achieved in embodiments of the invention using either a forward deflection in which solder droplets 14 are deflected onto a substrate or using a back deflection process in which solder droplets are deflected into the catch chute 64. Both of these processes are described below.

Figure 17:
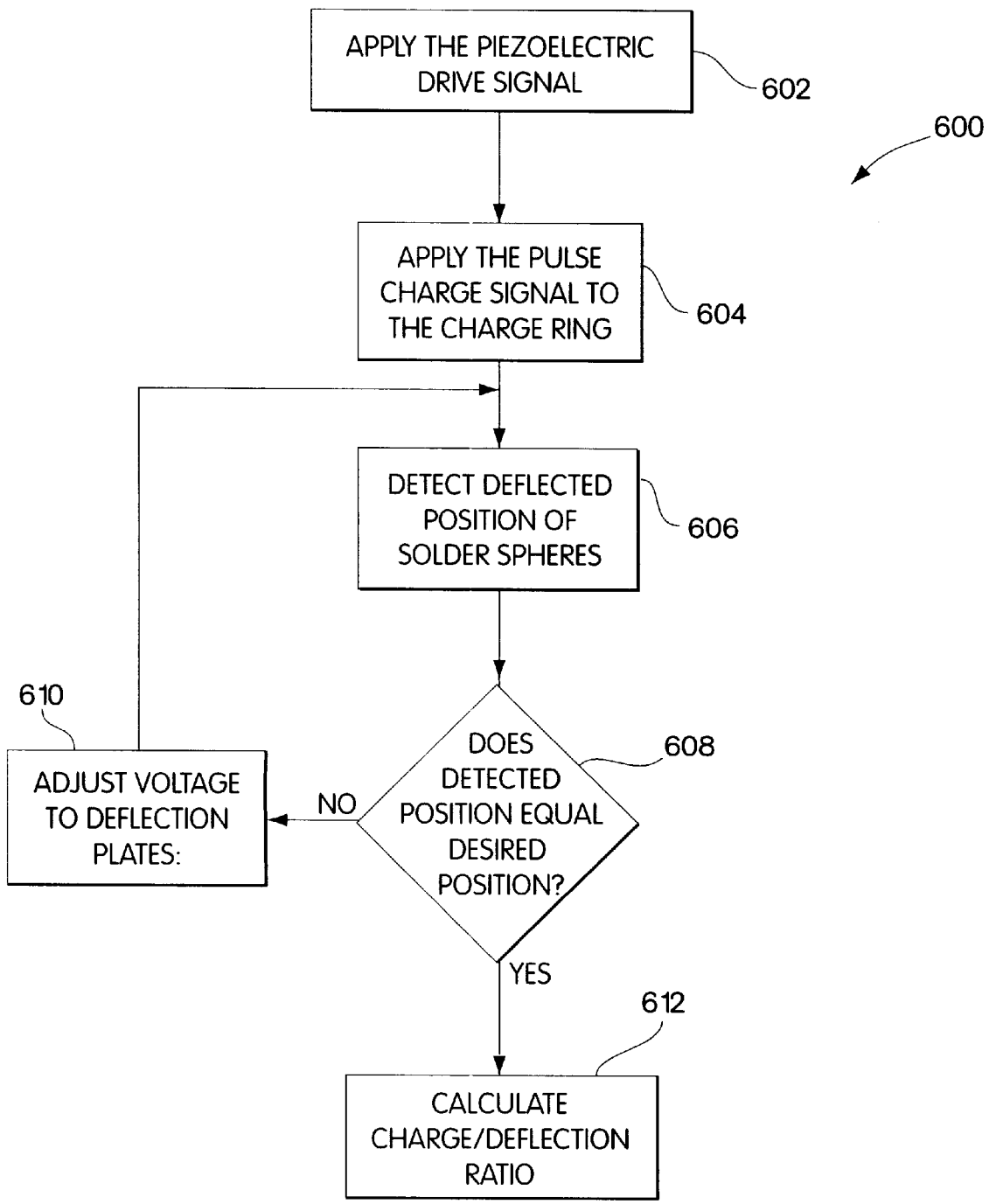
FIG. 17 is a flow chart showing the operation of a deflection control system in accordance with one embodiment of the present invention.

The back deflection calibration process 600 will be described with reference to FIG. 17. Steps 602, 604 and 606 of process 600 are similar to steps 572, 574 and 576 of process 570, except that in process 600, the phase difference between the piezoelectric drive signal and the pulse charge signal is set equal to the phase of maximum charging. The magnitude of the pulse charge signal is set equal to the maximum positive value, so that the jetted solder droplets will be deflected into the catch chute 60. In step 608, the controller determines whether the position of maximum deflection detected in step 604 is equal to a desired position of maximum deflection. The desired position of maximum deflection is previously stored in the controller and determines the width of the deflection axis.

In step 608, the controller determines whether the detected position of maximum deflection is equal to the desired position of maximum deflection. If the outcome of decision block 608 is "no", then in step 610, the voltage applied to the deflection plates is adjusted. The nominal voltage differential applied to the deflection plates is 6000 volts, and the controller in step 610 varies the voltage about this nominal value as necessary. Steps 606, 608 and 610 are repeated until the outcome of decision block 608 is "yes".

Once the outcome of decision block 608 is "yes", then the controller calculates a charge/deflection ratio based on the magnitude of the charge pulse and the amount of deflection provided by the deflection plates (step 612). The charge/deflection ratio is used by the controller during the jetting of solder droplets 14 to determine the required magnitude of the charge signal to provide a desired deflection. The required magnitude is calculated by multiplying the charge/deflection ratio with the desired deflection. This calibration procedure assumes that a linear relationship exists between the magnitude of the charge pulse and the deflection of the jetted droplets 14.

Figure 18:
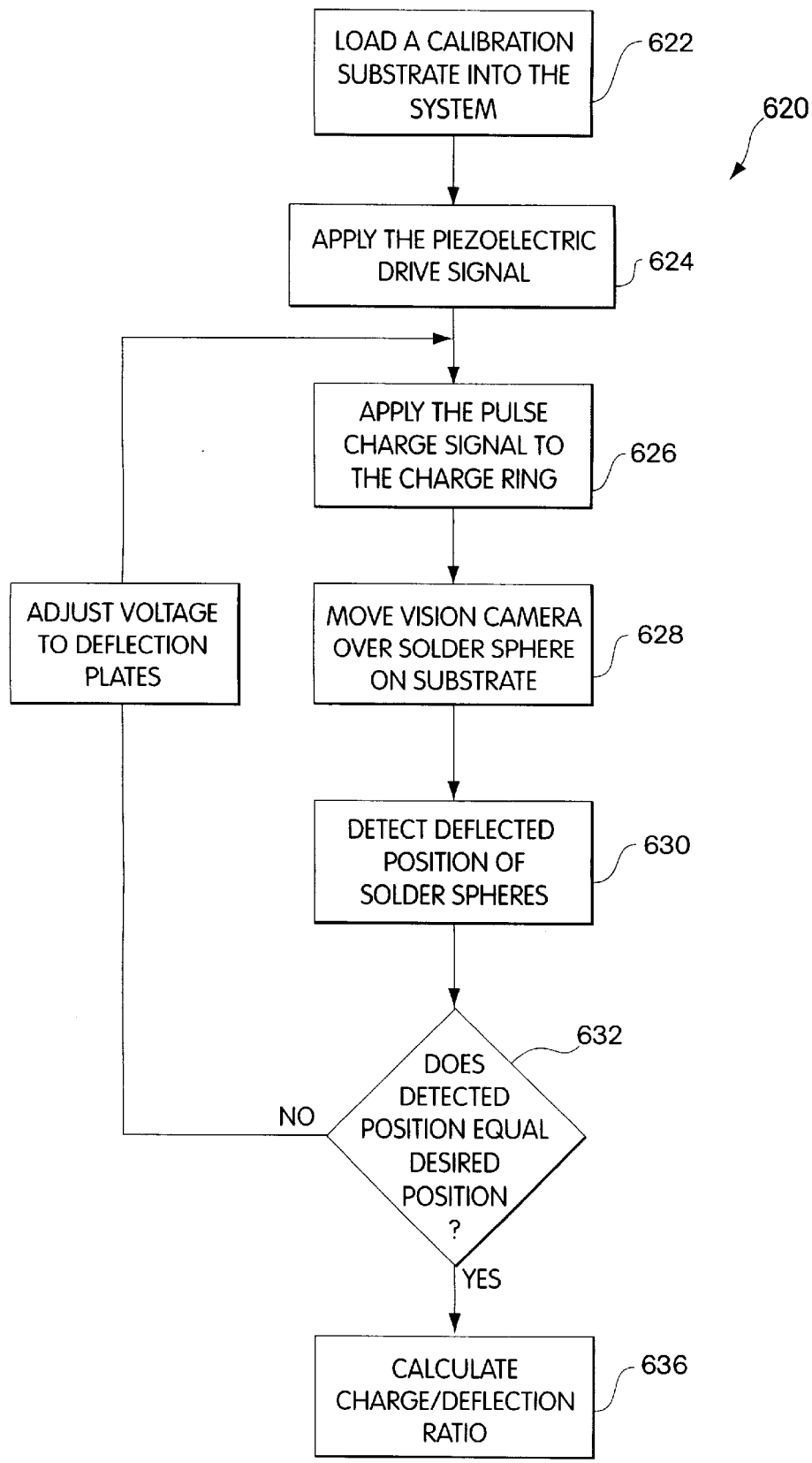
FIG. 18 is a flow chart showing the operation of an alternate deflection control system in accordance with one embodiment of the present invention.

The forward deflection calibration process 620 will be described with reference to FIG. 18. In step 622 of process 620, a calibration substrate is positioned in the jetting system and properly aligned in the system using the substrate alignment camera 54. Steps 624 and 626 of calibration process 620 are similar to steps 602 and 604 of calibration process 600, except that in step 626 the magnitude of the charge signal is set equal to the negative maximum value to direct a jetted solder droplets 14 through the print chute 68 and onto the calibration substrate. In step 628, the calibration substrate is moved to position the jetted solder droplet 14 under the camera 54, and in step 630, the position of the jetted solder droplet 14 is detected by the camera and the controller. Steps 632, 634 and 636 of process 620, in a manner similar to steps 608, 610 and 612, adjust the voltage on the deflection plates and determine the charge deflection ratio.

Either the forward deflection process or the backward deflection process may be used to calibrate the deflection control system. The backward deflection process is advantageous in that it is non-destructive and does not require that a calibration substrate be loaded into the jetting system. The forward deflection process is advantageous in that it determines the deflected position on a substrate, and thus, may be more accurate than the backward deflection process.

Having thus described at least one illustrative embodiment of the invention, alterations, modifications and improvements will readily occur to those skilled in the art. Such alterations, modifications and improvements are intended to be within the scope and spirit of the invention. Accordingly, the foregoing description is by way of example only. It is not intended as limiting. The invention's limit is defined only in the following claims and the equivalents thereto.

What is claimed is:

1. A control system for a jetting system comprising, an alignment system and a gimbal system, said alignment system having at least one monitoring device and at least one control device to monitor position of substances released from an ejector for adjustment of said substance position, said gimbal system connected to said ejector and having at least one movable section including at least one motor for adjusting the position of said ejector.

2. The control system of claim 1, wherein the alignment system includes:

a first detection system that detects an amount of deviation of the substances from an ejection axis along a first axis that is orthogonal to the ejection axis; and wherein the gimbal system is in communication with the first detection system and rotates the ejector about a first rotational axis to reduce the amount of deviation along the first axis, the first rotational axis passing through the ejector and being orthogonal to the ejection axis and parallel to a second axis that is orthogonal to the ejection axis and the first axis.

3. The control system of claim 2, wherein the alignment system further includes:

a second detection system that detects an amount of deviation of the substances from the ejection axis along the second axis; and wherein the gimbal system is in communication with the second detection system and rotates the ejector about a second rotational axis to reduce the deviation along the second axis, the second rotational axis passing through the ejector and being orthogonal to the ejection axis and the first rotational axis.

4. The control system of claim 1, wherein the ejector includes an orifice, and wherein the ejector is mounted to the gimbal system such that the ejector can be rotated about three orthogonal axes that pass approximately through the orifice.

5. A jetting system for dispensing drops of material along an ejection axis onto a substrate, the system comprising:

an ejector from which a stream of the material is ejected a deflection device; and a control system;

said ejector including a chamber containing the material to be dispensed, a vibration device, an orifice defining structure, and a charging device;

said vibration device providing disturbances in the stream of material to cause the stream to be fractured into drops said orifice-defining structure defining an orifice which the material is ejected;

said charging device being positioned below said orifice to receive the drops of material and apply an electric charge to the drops;

said deflection device receiving drops from said charging device to deflect said drops in a predetermined manner;

said control system including an alignment system and a gimbal system and communicating with said deflection device and said ejector to calibrate and control the deflection device and the ejector said alignment system having at least one monitoring device and at least one control device to monitor position of said drops of material and control the position of the drops by adjusting said ejector and said gimbal system;

said gimbal system being connected to said ejector and having at least one moveable section including at least one motor for adjusting position of said ejector.

6. The jetting system of claim 5, wherein the alignment system includes:

a first detection system that detects an amount of deviation of the stream from the ejection axis along a first axis that is orthogonal to the ejection axis; and wherein the gimbal system is in communication with the first detection system and rotates the ejector about a first rotational axis to reduce the amount of deviation along the first axis, the first rotational axis passing through the orifice and being orthogonal to the ejection axis and parallel to a second axis that is orthogonal to the ejection axis and the first axis.

7. The jetting system of claim 6, wherein the alignment system further includes:

a second detection system that detects an amount of deviation of the stream from the ejection axis along the second axis; and wherein the gimbal system is in communication with the second detection system and rotates the ejector about a second rotational axis to reduce the deviation along the second axis, the second rotational axis passing through the orifice and being orthogonal to the ejection axis and the first rotational axis.

8. The jetting system of claim 7, wherein the first detection system includes a first viewing system having a viewing axis parallel to the second axis, and the second detection system includes a second viewing system having a viewing axis parallel to the first axis.

9. The jetting system of claim 8, wherein the drops ejected from the ejector have a velocity, and wherein the jetting system further comprises:

a pressurized gas system coupled to the chamber to supply a pressurized gas to the chamber, the pressurized gas in the chamber having a gas pressure; and a velocity control system that adjusts the gas pressure to maintain the velocity of the drops at a predetermined value, the control system adjusting the gas pressure based on an initial amount of material in the chamber and based on an amount of material ejected from the chamber.

10. The jetting system of claim 8, wherein the drops ejected from the ejector have a velocity, and wherein the jetting system further comprises:

a pressurized gas system coupled to the chamber to supply a pressurized gas to the chamber, the pressurized gas in the chamber having a gas pressure;

a detection system that detects changes in the velocity of the liquid drops;

a velocity control system, coupled to the detection system and the pressurized gas system, that adjusts the gas pressure based on the velocity detected by the detection system to maintain the velocity of the stream at the predetermined value.

11. The jetting system of claim 10, wherein the drops are ejected at a predetermined frequency, and wherein the first viewing system views the drops ejected from the jetting system, the first viewing system including a strobe system having a strobe frequency related to the predetermined frequency at which the drops are ejected such that the first viewing system captures images of the drops at a frequency equal to the strobe frequency.

12. The jetting system of claim 11, further comprising:

a deflection control system that controls the amount of deflection provided by the deflection device, such that a drop having a maximum charge is deflected a predetermined maximum deflection distance.

13. The jetting system of claim 12, wherein the deflection device includes a pair of parallel plates and a deflection power supply coupled to the parallel plates to provide a deflection voltage across the parallel plates, and wherein the deflection control system is coupled to the deflection power supply to vary the voltage provided by the power supply in response to an amount of deflection determined by the viewing system.

14. The jetting system of claim 13, wherein the ejector is mounted to the jetting system using the gimbal system such that the ejector can be rotated about three orthogonal axes that pass approximately through the orifice.

15. The jetting system of claim 5, wherein the drops ejected from the ejector have a velocity, and wherein the jetting system further comprises:

a pressurized gas system coupled to the chamber to supply a pressurized gas to the chamber, the pressurized gas in the chamber having a gas pressure; and a velocity control system that adjusts the gas pressure to maintain the velocity of the drops at a predetermined value, the control system adjusting the gas pressure based on an initial amount of material in the chamber and based on an amount of material ejected from the chamber.

16. The jetting system of claim 5, wherein the drops ejected from the ejector have a velocity, and wherein the jetting system further comprises:

a pressurized gas system coupled to the chamber to supply a pressurized gas to the chamber, the pressurized gas in the chamber having a gas pressure;

a detection system that detects changes in the velocity of the liquid drops;

a velocity control system, coupled to the detection system and the pressurized gas system, that adjusts the gas pressure based on the velocity detected by the detection system to maintain the velocity of the stream at the predetermined value.

17. The jetting system of claim 5, wherein the charging device has an input to receive a charge signal, the charge signal having charge pulses with a pulse frequency and a variable pulse magnitude, the charging device, upon receipt of a charge pulse, applying a charge to a corresponding one of the drops during an effective charging period of the one of the drops, the charge applied to the one of the drops having a magnitude that is based on the magnitude of the corresponding charge pulse, and wherein the deflection device receives the drops from the charging device and deflects the stream along a deflection axis, an amount of deflection of each one of the drops being related to the magnitude of the charge applied, the jetting system further comprising:

a charge control system that controls the charging device such that the corresponding pulse for each one of the drops is applied to the charging device during the effective charging period for the one of the drops.

18. The jetting system of claim 5, further comprising:

a deflection control system that controls the amount of deflection provided by the deflection device, such that a drop having a maximum charge is deflected a predetermined maximum deflection distance.

19. The jetting system of claim 5, wherein the ejector is constructed and arranged to be a replaceable unit so that the ejector may be replaced by a new ejector when the material within the chamber has been dispensed.

20. The jetting system of claim 5, wherein the ejector is mounted to the jetting system using the gimbal system such that the ejector can be rotated about three orthogonal axes that pass approximately through the orifice.

21. The jetting system of claim 20, wherein when the ejector is mounted to the jetting system, a conductive surface of the charging device contacts a conductive surface of the jetting system to allow the charging device to receive a charge signal.

* * * * *